US011018247B1

(12) United States Patent
Radic et al.

(10) Patent No.: US 11,018,247 B1
(45) Date of Patent: May 25, 2021

(54) SEMICONDUCTOR DEVICE WITH A BASE LINK REGION AND METHOD THEREFOR

(71) Applicant: NXP USA, INC., Austin, TX (US)

(72) Inventors: Ljubo Radic, Gilbert, AZ (US); Jay Paul John, Chandler, AZ (US); Bernhard Grote, Phoenix, AZ (US); James Albert Kirchgessner, Tempe, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/727,591

(22) Filed: Dec. 26, 2019

(51) Int. Cl.
| | |
|---|---|
| *H01L 29/737* | (2006.01) |
| *H01L 29/165* | (2006.01) |
| *H01L 29/08* | (2006.01) |
| *H01L 29/10* | (2006.01) |
| *H01L 29/66* | (2006.01) |
| *H01L 21/311* | (2006.01) |

(Continued)

(52) U.S. Cl.
CPC ...... *H01L 29/7371* (2013.01); *H01L 21/0262* (2013.01); *H01L 21/02532* (2013.01); *H01L 21/26513* (2013.01); *H01L 21/30604* (2013.01); *H01L 21/31111* (2013.01); *H01L 21/324* (2013.01); *H01L 29/0817* (2013.01); *H01L 29/0826* (2013.01); *H01L 29/1004* (2013.01); *H01L 29/165* (2013.01); *H01L 29/66242* (2013.01)

(58) Field of Classification Search
CPC ........... H01L 29/7371; H01L 21/05232; H01L 21/0262; H01L 21/26513; H01L 21/30604; H01L 21/31111
See application file for complete search history.

(56) References Cited

U.S. PATENT DOCUMENTS

| | | |
|---|---|---|
| 7,105,415 B2 | 9/2006 | Bock et al. |
| 7,803,685 B2 | 9/2010 | John et al. |

(Continued)

OTHER PUBLICATIONS

Vu, V.T. el al.; "Advanced Si/SiGe HBT architecture for 28-nm FD-SOI BiCMOS;" Published in 2016 IEEE Bipolar/BiCMOS Circuits and Technology Meeting (BCTM); Date of Conference: Sep. 25-27, 2016, New Brunswick, NJ, USA; DOI: 10.1109/BCTM.2016.7738955.

(Continued)

*Primary Examiner* — Zandra V Smith
*Assistant Examiner* — Andre C Stevenson
(74) *Attorney, Agent, or Firm* — Bruce M. Green

(57) ABSTRACT

A semiconductor device includes a semiconductor substrate with a collector region formed within the semiconductor substrate. A base region, including a first base region and a second base region, is formed over the collector region. An extrinsic base region is formed laterally adjacent to and coupled to the second base region. A base link region is disposed proximate to the second base region, wherein the base link region couples the extrinsic base sidewall to the second base region. A method for forming a semiconductor device includes forming the collector region within the semiconductor substrate, forming a plurality of dielectric layers over the collector region, forming an extrinsic base layer over the collector region, etching an emitter window, forming the first base region over the collector region, forming the second base region over the first base region, wherein forming the second base region includes forming the base link region.

23 Claims, 14 Drawing Sheets

(51) Int. Cl.
*H01L 21/265* (2006.01)
*H01L 21/324* (2006.01)
*H01L 21/02* (2006.01)
*H01L 21/306* (2006.01)

(56) References Cited

U.S. PATENT DOCUMENTS

| | | |
|---|---|---|
| 8,933,537 B2 | 1/2015 | Fox et al. |
| 8,946,861 B2 | 2/2015 | Camillo-Castillo et al. |
| 9,570,564 B2 * | 2/2017 | Alperstein ............ H01L 29/732 |
| 2005/0212087 A1 * | 9/2005 | Akatsu ............... H01L 29/0649 |
| | | 257/565 |
| 2014/0151852 A1 * | 6/2014 | Adkisson ............ H01L 29/1004 |
| | | 257/565 |
| 2015/0137185 A1 * | 5/2015 | Camillo-Castillo ........................ |
| | | H01L 29/0649 |
| | | 257/197 |
| 2019/0305119 A1 | 10/2019 | John et al. |

OTHER PUBLICATIONS

Camillo-Castillo, R.A., et al.; "SiGe HBTs in 90nm BiCMOS technology demonstrating 300GHz/420GHz fT/fMAX through reduced Rb and Ccb parasitics," Published in 2013 IEEE Bipolar/BiCMOS Circuits and Technology Meeting (BCTM); Date of Conference: Sep. 30-Oct. 3, 2013, Bordeaux, France, DOI: 10.1109/BCTM.2013. 6798182.

* cited by examiner

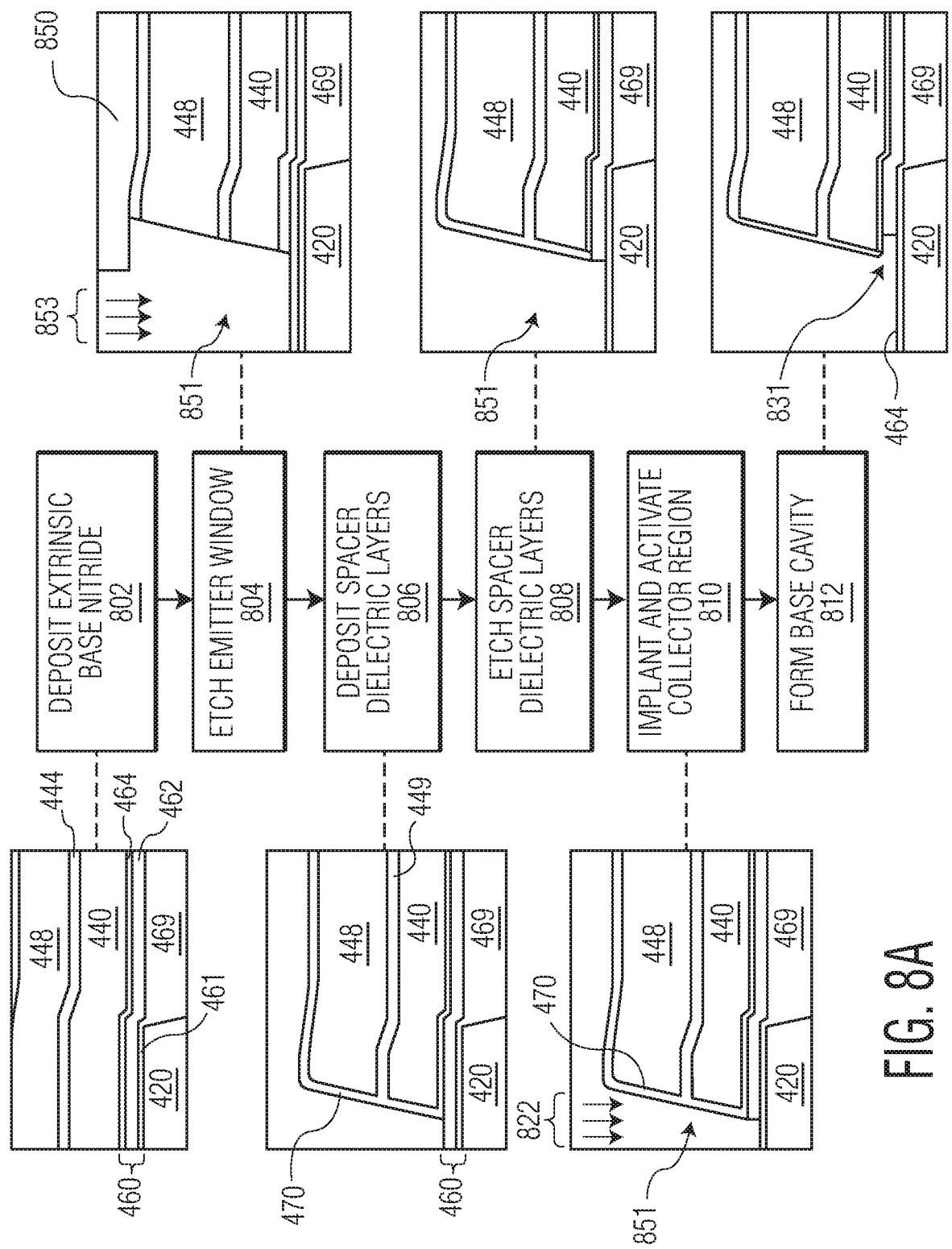

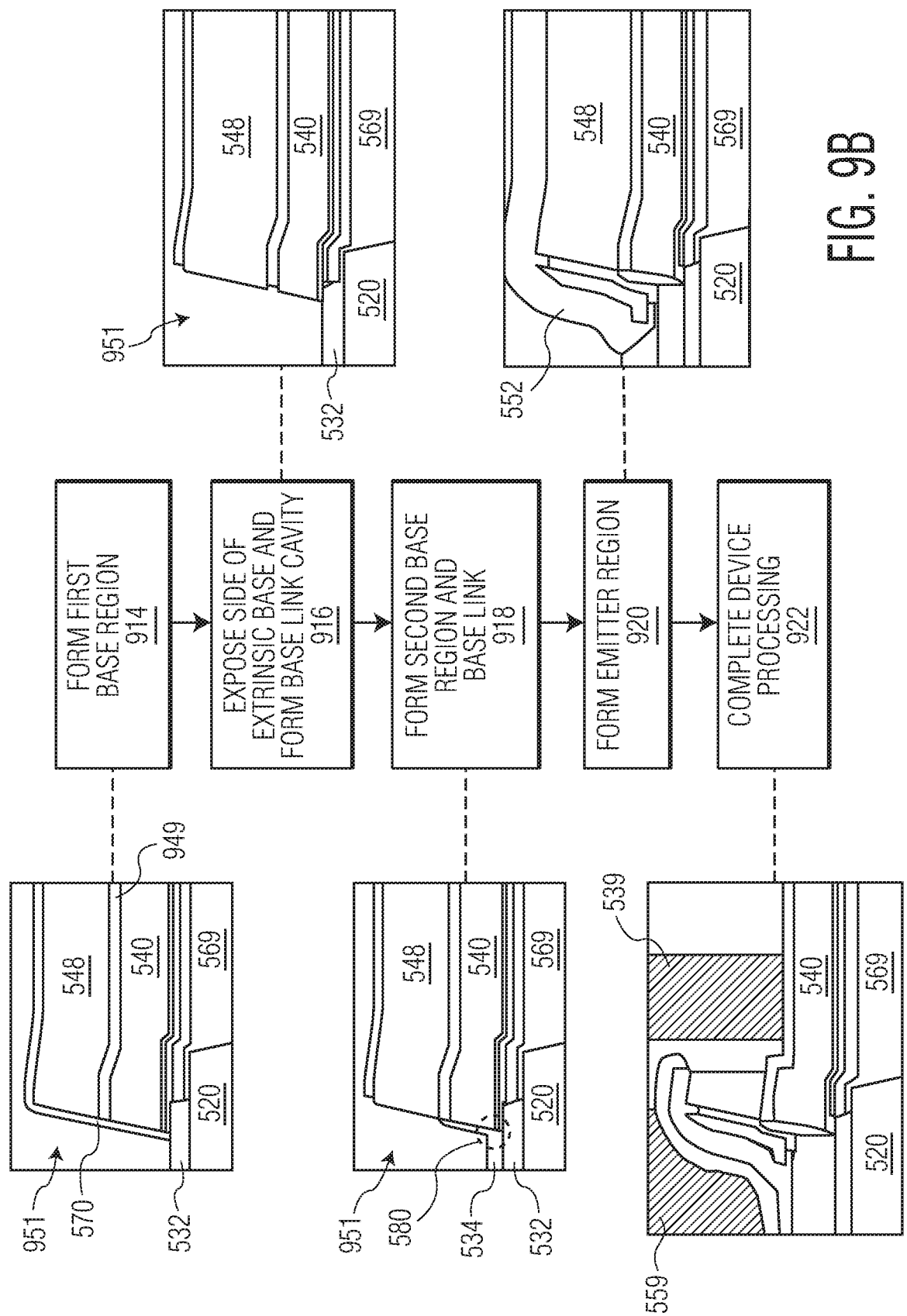

SEMICONDUCTOR DEVICE WITH A BASE LINK REGION AND METHOD THEREFOR

TECHNICAL FIELD

Embodiments of the subject matter described herein relate generally to semiconductor devices, including bipolar junction transistors (BJT's) and heterojunction bipolar transistors (HBT's).

BACKGROUND

Semiconductor devices find application in a wide variety of electronic components and systems. Moreover, useful semiconductor devices for radio frequency (RF), microwave, and millimeter wave applications may include BJT's, HBT's, and related devices. In particular, HBT's are useful in high frequency applications because of their fast transit time, high cutoff frequency, high gain, and good linearity properties. These HBT's act as active gain elements and find applications as active devices in RF, microwave, and millimeter wave power amplifiers, oscillators, and other useful electronic components. In these and other applications for these devices, there is a need for reduced base resistance. Reduced base resistance is important for achieving higher maximum frequency of oscillation ($f_{max}$) and improved frequency response for these applications. The value of $f_{max}$ is inversely proportional to base resistance ($R_b$) and collector junction capacitance ($C_{jc}$). Conventional BJT and HBT structures, both intrinsically trade-off $R_b$ and collector junction capacitance $C_{jc}$. Thus, semiconductor devices, including BJT's and HBT's, with reduced $R_b$ and $C_{jc}$ are desired.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIGS. 8A and 8B are a process flow diagrams with corresponding cross sectional views describing a method for fabricating the semiconductor devices of FIG. 4 in accordance with an embodiment.

FIGS. 9A and 9B are a process flow diagrams with corresponding cross sectional views describing a method for fabricating the semiconductor devices of FIG. 5 in accordance with an embodiment.

DETAILED DESCRIPTION

Figure 1:
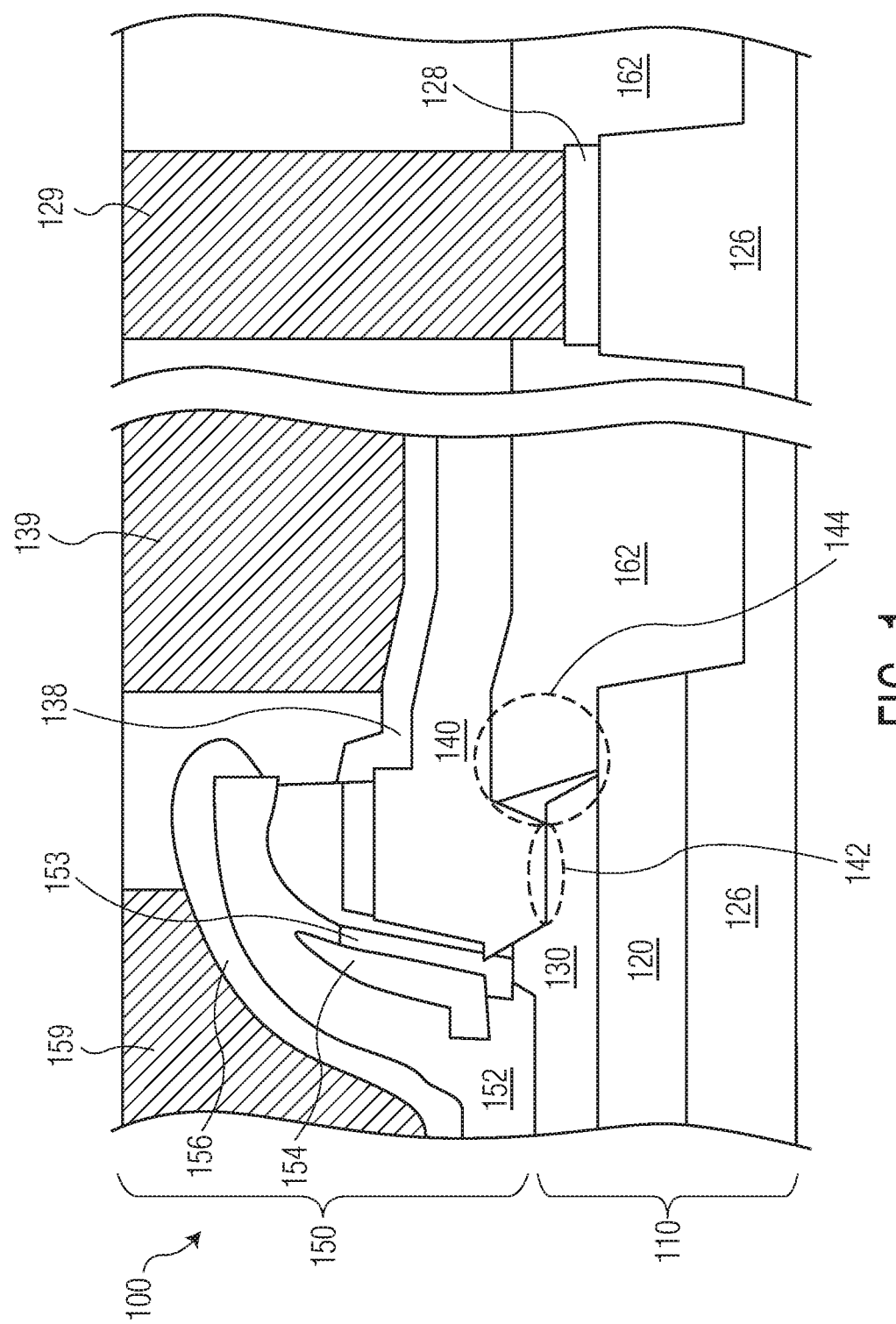
FIG. 1 is a cross sectional side view of a conventional device.

Embodiments of a semiconductor device are described herein. In one aspect, an embodiment of a semiconductor device may include a semiconductor substrate and a collector region formed within the semiconductor substrate. According to an embodiment, the collector region may include an upper surface and a collector sidewall. A semiconductor device may further include a base region that includes a first base region disposed over the collector region and a second base region disposed over and coupled to the first base region, according to an embodiment. According to an embodiment, the extrinsic base region may include an upper surface, a lower surface, and an extrinsic base sidewall formed laterally adjacent to and coupled to the base region. An embodiment may include a base link region disposed proximate to and coupled to the second base region, wherein the base link region couples the extrinsic base sidewall to the second base region.

Embodiments of the inventive subject matter may also include a first spacer dielectric layer disposed over at least a portion of the extrinsic base sidewall. An embodiment may include an extrinsic base opening formed in the first spacer dielectric layer, wherein the extrinsic base opening includes a portion of the extrinsic base sidewall. The base link region may be formed within at least a portion of the extrinsic base opening, according to an embodiment. In an embodiment, a portion of the base link region may be formed within a base link cavity formed between the extrinsic base opening and a second spacer dielectric layer disposed over the first spacer dielectric layer. An embodiment may include a first dielectric layer formed under the lower surface of the extrinsic base region and over a portion of the collector region, wherein a portion of the first dielectric layer is formed between the first base region and the extrinsic base region. In an embodiment, a plurality of dielectric layers may be disposed laterally adjacent the base region and under the extrinsic base region, wherein a portion of each of the plurality of dielectric layers may be disposed between a portion of the collector region and the extrinsic base region. The plurality of dielectric layers may include a first dielectric layer formed over a second dielectric layer that is formed over a portion of the collector region, according to an embodiment. In an embodiment, a third dielectric layer may be formed between the second dielectric layer and the collector region. A fourth dielectric layer may be formed between the third dielectric layer and the collector region, according to an embodiment. In an embodiment, a fifth dielectric layer may be formed between the fourth dielectric layer and the collector region. An emitter region may be disposed over the base region, according to an embodiment. In an embodiment, the substrate, collector region, base region, and emitter region may include silicon and the base region may include an alloy of silicon and germanium.

In another aspect, an embodiment of the inventive subject matter may include a bipolar transistor device that includes a semiconductor substrate and a collector region formed within the semiconductor substrate. According to an embodiment, the collector region may include an upper surface and a collector sidewall. A base region may be disposed over the collector region and may include a first base region and a second base region disposed over and coupled to the first base region, according to an embodiment. An embodiment may include an emitter region disposed over the base region. An extrinsic base region may include an upper surface, a lower surface, and an extrinsic base sidewall laterally adjacent to and coupled to the base region, according to an embodiment. In an embodiment, a plurality of dielectric layers may be disposed laterally adjacent the base region, under the extrinsic base region, wherein a portion of each of the plurality of dielectric layers may be disposed between a portion of the collector region and the extrinsic base region. A spacer dielectric layer may be disposed over at least a portion of the extrinsic base sidewall, according to an embodiment. In an embodiment, an extrinsic base opening may be formed in the spacer dielectric layer wherein, the extrinsic base opening may include a portion of the extrinsic base sidewall. A base link region may be disposed proximate the second base region, and on at least a portion of the extrinsic base opening, according to an embodiment. The base link region may laterally couple at least the second base region to the extrinsic base region, wherein the extrinsic base sidewall may be coupled to a sidewall of the second base region.

In some embodiments, the plurality of dielectric layers may include a first dielectric layer formed over a second dielectric layer formed between the first dielectric layer and the collector region, wherein each of the first and second dielectric layer include a portion formed over a portion of the collector region.

In other embodiments, the plurality of dielectric layers may include a first dielectric layer, a second dielectric layer formed between the first dielectric layer and the collector region, a third dielectric layer formed between the second dielectric layer and the collector region, a fourth dielectric layer formed between the third dielectric layer and the collector region, and a fifth dielectric layer formed between the fourth dielectric layer and the collector region. Each of the first dielectric layer, the second dielectric layer, the third dielectric layer, the fourth dielectric layer, and the fifth dielectric layer may include a portion disposed between the extrinsic base region and the collector region, according to an embodiment.

In still other embodiments, the plurality of dielectric layers may include a first dielectric layer, a second dielectric layer formed between the first dielectric layer and the collector region, and a third dielectric layer formed between the second dielectric layer and the collector region, wherein each of the first dielectric layer, the second dielectric layer, and the third dielectric layer include a portion disposed between the extrinsic base region and the collector region.

In still other, further embodiments, the plurality of dielectric layers may include a first dielectric layer, a second dielectric layer formed between the first dielectric layer and the collector region, a third dielectric layer formed between the second dielectric layer and the collector region, a fourth dielectric layer formed between the third dielectric layer and the collector region, and a fifth dielectric layer formed between the fourth dielectric layer and the collector region, wherein each of the first dielectric layer, the second dielectric layer, the third dielectric layer, the fourth dielectric layer, and the fifth dielectric layer include a portion disposed between the extrinsic base region and the collector region.

In another aspect of the inventive subject matter, a method for forming a bipolar transistor is disclosed. In an embodiment, the method may include forming a collector region within a semiconductor substrate, forming a plurality of dielectric layers over the collector region and forming an extrinsic base layer over the collector region and the plurality of dielectric layers. An embodiment of the method may include etching an emitter window through the extrinsic base layer and at least one of the plurality of dielectric layers over the collector region to form an extrinsic base sidewall and the extrinsic base region. The method may further include forming a spacer dielectric layer over the extrinsic base region and over the extrinsic base sidewall, forming an extrinsic base opening in the spacer dielectric layer on at least a portion of the extrinsic base sidewall by etching the spacer dielectric layer and at least one of the plurality of dielectric layers, according to an embodiment. The method may also include forming a first base region over the collector region, adjacent the extrinsic base, and forming a second base region over the first base region, according to an embodiment. In an embodiment, forming the second base region may include forming a base link region on at least a portion of the extrinsic base opening that laterally couples the second base region to the extrinsic base region. In an embodiment, the base link region may couple the extrinsic base sidewall to the base sidewall. In an embodiment, the method may include forming an emitter region over the base region.

In some embodiments of the method, forming the plurality of dielectric layers may include forming a second dielectric layer over the collector region and forming a first dielectric layer over the second dielectric layer. Each of the first dielectric layer and the second dielectric layer may include a portion disposed over the collector region, according to an embodiment.

In other embodiments of the method, forming the plurality of dielectric layers may include forming a fifth dielectric layer over the collector region, forming a fourth dielectric layer over the fifth dielectric layer, forming a third dielectric layer over the fourth dielectric layer, forming a second dielectric layer over the third dielectric layer, and forming a first dielectric layer over the second dielectric layer, wherein each of the first dielectric layer, the second dielectric layer, the third dielectric layer, the fourth dielectric layer, and the fifth dielectric layer may include a portion disposed over the collector region.

In still other embodiments of the method, forming the plurality of dielectric layers may include forming a third dielectric layer over the collector region, forming a second dielectric layer over the third dielectric layer, and forming a first dielectric layer over the second dielectric layer, wherein each of the first dielectric layer, the second dielectric layer, and the third dielectric layer include a portion disposed over the collector region.

In still other, further embodiments of the method, forming the plurality of dielectric layers may include forming a fourth dielectric layer over the collector region, forming a third dielectric layer over the fourth dielectric layer, forming a second dielectric layer over the third dielectric layer, and forming a first dielectric layer over the second dielectric layer, wherein each of the first dielectric layer, the second dielectric layer, the third dielectric layer, and the fourth dielectric layer include a portion disposed over the collector region.

FIG. 1 is a cross sectional side view of a conventional device 100. According to an embodiment, the conventional device 100 may include a semiconductor substrate 110, a collector region 120 formed within the semiconductor substrate 110, a base region 130 disposed over the collector region 120, an extrinsic base region 140 coupled to the base region 130, and an emitter region 150 formed over the base region 130. As with other figures presented herein, FIG. 1 depicts a symmetric half of the conventional device 100. The full conventional device 100 may be realized by mirroring the depicted elements of the conventional device 100 about a vertical axis of the emitter region 150.

Referring again to FIG. 1, and in an embodiment, the semiconductor substrate 110 may include a number of semiconductor regions. As used herein, the term, "semiconductor region" may refer to single or multiple semiconductor regions that may include regions formed by implantation (e.g. ion implantation) or layers grown by epitaxial growth. In an embodiment, the collector region 120 may be formed within the semiconductor substrate 110. A base region 130 may be formed over and in contact with the collector region 120. An extrinsic base region 140 is typically used to couple the base region 130 to a base electrode 139.

In the conventional device 100, the semiconductor substrate 110 may include silicon (Si), carbon (C) and/or germanium (Ge). In the conventional device, the collector region 120 is formed in an upper portion of the semiconductor substrate 110. The base region 130 is typically formed over the collector region 120. The collector region 120, the base region 130, and the emitter region 150 may include one or more of Si, C and/or Ge. The conventional device 100 is typically configured as a npn transistor such that collector region 120 and the emitter region 150 include a n-type semiconductor and the base region 130 includes a p-type semiconductor. The collector region 120 is typically formed within the semiconductor substrate 110. A sub-collector region 126 is typically formed below the collector region 120 within the semiconductor substrate 110 and is used to provide an electrical path to a collector electrode 129 through a contact layer 128. In an embodiment, the sub-collector region 126 is typically doped at a higher level than the doping concentration of the collector region 120. A dielectric material layer 162 is typically used to provide isolation between devices.

In the conventional device 100, the base region 130 is typically formed over the collector region 120. The base region 130 is typically formed using Si or a mixed crystal alloy of Si and Ge, SiGe. In a conventional npn device, the base region 130 is formed using a p-type semiconductor. The base region 130 is typically doped with boron (B). In pnp conventional devices the base region 130 is formed using an n-type semiconductor. The extrinsic base region 140 may be formed over the semiconductor substrate 110 and provides a low resistance connection to the base electrode 139. In a conventional device there is typically an overlap region 142 between the base region 130 and the extrinsic base region 140 over the collector in order to provide a low contact resistance between the base region 130 and the extrinsic base region 140 so as to provide a lower overall base resistance $R_b$. While the overlap region 142 helps to provide a low value of $R_b$, it creates a large extrinsic base to collector coupling region 144 between the extrinsic base region 140 and the collector region 130. Moreover, the overlap region 142 allows B doping typically used in the formation of the poly extrinsic base to readily diffuse into the base region 130 during the formation of the base region 130. The addition of the B doping to the base region 130 may cause the base region 130 to be excessively with B-doped and may interfere with the efficient transport of carriers across the base region 130 during operation, thus increasing the base transit time and reducing the frequency response of the conventional device 100.

In the conventional device 100, the emitter region 150 may be formed over the base region 130. According to an embodiment, the emitter region 150 may include an intrinsic emitter region 152, a first emitter spacer layer 153, a second emitter spacer layer 154, and an emitter contact layer 156 formed over the intrinsic emitter region 152. The emitter region 150 may also include an emitter electrode 159 formed over the emitter contact layer 156, according to an embodiment.

Figure 2:
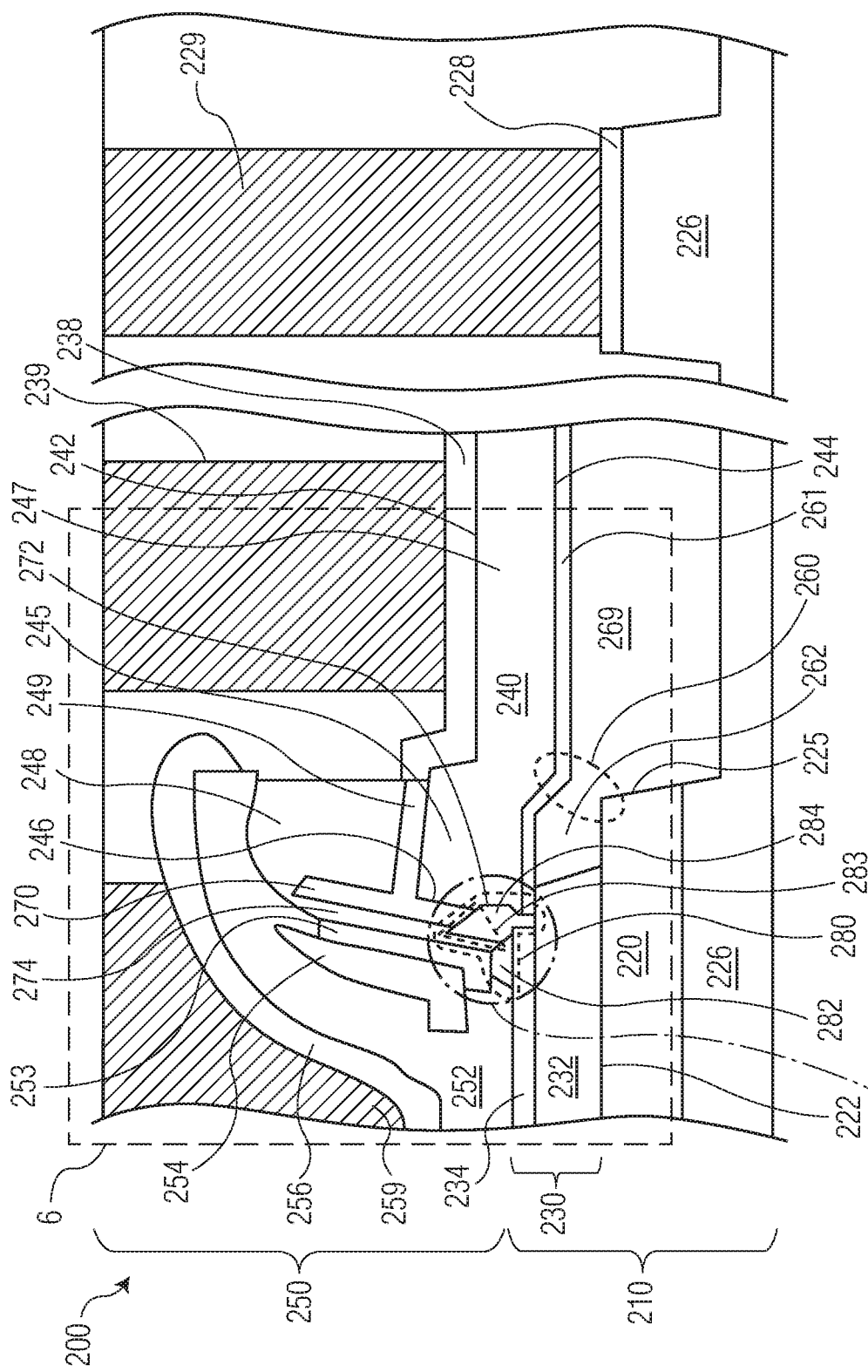
FIG. 2 is a cross sectional side view of a semiconductor device in accordance with an embodiment.

FIG. 2 is a cross sectional side view of an exemplary semiconductor device 200, according to an embodiment. According to an embodiment, a semiconductor device may include a semiconductor substrate 210, a collector region 220 formed within the semiconductor substrate 210, a base region 230 disposed over the collector region 220, an emitter region 250 formed over the base region 230, an extrinsic base region 240 coupled to the base region 230, a plurality of dielectric layers 260 formed under the extrinsic base region 240, a first spacer dielectric layer 270 formed over a portion of the extrinsic base region 250, and a base link region 280 that couples the base region 230 to the extrinsic base region 240.

Referring again to FIG. 2, and in an embodiment, the semiconductor substrate 210 may include a number of semiconductor regions. As used herein, the term, "semiconductor region" may refer to single or multiple semiconductor regions that may include regions formed by implantation (e.g. ion implantation) or layers grown by epitaxial growth. In an embodiment, the collector region 220 may be formed within the semiconductor substrate 210. According to an embodiment, a base region 230 may be formed over and in contact with the collector region 220.

In an embodiment, the semiconductor substrate 210 may include one or more of silicon (Si), germanium (Ge), silicon germanium (SiGe), gallium arsenide (GaAs), gallium phosphide (GaP), indium gallium phosphide (InGaP), indium phosphide (InP), gallium nitride (GaN), aluminum nitride (AlN), indium nitride (InN), silicon carbide (SiC), sapphire, or other suitable materials. In other embodiments, the semiconductor substrate 210 may include Si on insulator (SOI). In an embodiment, the collector region 220 may be formed in an upper portion of the semiconductor substrate 210. The base region 230 may be formed over the collector region 220, according to an embodiment. In an embodiment, the collector region 220, the base region 230, and the emitter region 250 may include one or more of Si, Ge, SiGe and SiGeC. In other embodiments, the collector region 220, the base region 230, and the emitter region 250 may include one or more of GaAs, GaN, AlN, InN, InGaP, and/or other suitable materials. In an embodiment, the semiconductor device 200 may be configured as a npn transistor such that the collector region 220 and the emitter region 250 include a n-type semiconductor and the base region 230 include a p-type semiconductor. In other embodiments, the semiconductor device 200 may be configured as a pnp transistor such that collector region 220 and the emitter region 240 include a p-type semiconductor and the base region 230 includes a n-type semiconductor. As used herein, the term "p-type semiconductor" refers to a semiconductor material with a hole concentration ranging from about 1e15 cm$^{-3}$ to about 1e20 cm$^{-3}$, though other higher or lower hole concentrations may be included. As used herein, the term "n-type semiconductor" refers to a semiconductor material with a net electron concentration ranging from about 1e15 cm$^{-3}$ to about 1e20 cm$^{-3}$, though other higher or lower electron concentrations may be used.

In an embodiment, the collector region 220 may be formed within the semiconductor substrate 210. According to an embodiment, the collector region 220 may include an upper surface 222 and a collector sidewall 225. In some embodiments (e.g. npn transistor device), the collector region 220 may be formed using a n-type semiconductor. In other embodiments (pnp transistor device), the collector region 220 may be formed using a p-type semiconductor. In an embodiment, the collector region 220 may have a thickness of between about 200 angstroms and 2000 angstroms. In other embodiments, the collector region 220 may have a thickness between about 50 angstroms and about 5000 angstroms, though other thicknesses may be used. In embodiments that include a n-type collector region (e.g. npn transistors), the collector region 220 may be doped with one or more of phosphorous (P), arsenic (As), antimony (Sb), lithium (Li) or other suitable dopants. In embodiments that include a p-type collector region 220 (e.g. pnp transistors), the collector region 220 may be doped with one or more of carbon (C), boron (B), oxygen (O), or indium (In) though other dopant species may be used. The doping concentration of the collector region 220 may be in a range of 5e16 $cm^{-3}$ to 5e18 $cm^{-3}$ though other higher or lower dopant concentrations may be used. According to an embodiment, a sub-collector region 226 may be formed below the collector region 220 within the semiconductor substrate 210, and provides a low resistance connection to the collector electrode 229 through a contact layer 228. In an embodiment, the sub-collector region 226 may have the same doping polarity as the collector region 220, but may be doped at a higher doping concentration. In an embodiment, the doping concentration of the sub-collector region 226 may be in a range of about 5e18 $cm^{-3}$ to 1e21 $cm^3$. In an embodiment, the sub-collector region 226 may be doped 10 to 100 times higher than the doping concentration of the collector region 220. According to an embodiment, the sub-collector region 226 may be doped 100 to 1000 times higher concentration than the collector region 220.

In an embodiment, the base region 230 may be formed over the collector region 220. The base region 230 may include a first base region 232 and a second base region 234 disposed over and coupled to the first base region 232. In an embodiment, the second base region 234 may be formed over the first base region 232. In an embodiment, the base region 230 may be formed using a p-type semiconductor. In an embodiment, the base region 230 may be doped with carbon (C). In other embodiments, the base region 230 may be formed using a n-type semiconductor. In an embodiment, the base region 230 may be formed using $Si_{1-X}Ge_X$ where X is the Ge mole fraction. In an embodiment, one or more portions of the base region 230 may have a narrower bandgap than the emitter region 250. In an embodiment, the bandgap of the one or more portions of the base region 230 may be adjusted by changes in the Ge mole fraction. In an embodiment, the first base region 232 and the second base region 234 have the same bandgap (e.g. same Ge mole fraction, X). In an embodiment, the Ge mole fraction, X, may vary between about 0.05 and about 0.3 though other larger or smaller values of X may be used. In an embodiment, the value of the Ge mole fraction may be constant throughout the base region 230. In other embodiments, the first base region 232 may have a narrower bandgap than the second base region 234. In still other embodiments, the bandgap of the base region 230 may be continuously graded through both the first base region 232 and the second base region 234. In these embodiments, the grading of the base material, e.g. $Si_{1-X}Ge_X$ may include forming second base region 234 with a wider bandgap and continuously reducing to a narrower bandgap in the first base region 232. In an embodiment, the first base region 232 may have a thickness of between about 50 angstroms and 500 angstroms. In other embodiments, the first base region 232 may have a thickness between about 20 angstroms and about 2000 angstroms, though other thicknesses may be used. In an embodiment, the second base region 234 may have a thickness of between about 20 angstroms and 200 angstroms. In other embodiments, the second base region 234 may have a thickness between about 20 angstroms and about 2000 angstroms, though other thicknesses may be used. In an embodiment of a p-type base region, the first and second base regions 232 and 234 may be doped with one or more of C, B, O, or In though other dopant species may be used. In an embodiment of a n-type base region (e.g. a pnp transistor device), the first and second base regions 232 and 234 may be doped with one or more of P, Li, As, Sb though other dopant species may be used. In an embodiment, the doping concentration of the first base region 232 may be in a range of about 5e17 $cm^{-3}$ to 1e20 $cm^{-3}$. In other embodiments, the doping concentration of the first base region 232 may be in a range of about 1e17 $cm^{-3}$ to 1e20 $cm^{-3}$, though other higher or lower doping concentrations may be used.

In an embodiment, the extrinsic base region 240 may be formed over the semiconductor substrate 210 and may include an upper surface 242, a lower surface 244, and an extrinsic base sidewall 246 laterally adjacent to and coupled to the base region 230. In an embodiment, the extrinsic base region 240 may be formed using poly-silicon. In embodiments that include a p-type base region 230 (e.g. a npn transistor device), the extrinsic base region may be doped with one or more of B, O, In or Al, though other dopant species may be used. In embodiments that include a n-type base region 230 (e.g. a pnp transistor device), the extrinsic base region 240 may be doped with one or more of P, Li, As, or Sb though other dopant species may be used. In an embodiment, the extrinsic base region 240 may include the same dopant species as the base region 230. For example, the base region 230 and the extrinsic base region 240 may both include B doping. In an embodiment, the extrinsic base region 240 may include a first portion 245 formed over the collector region 220 and the base region 230 and a second portion 247 formed in areas of the device adjacent the collector region 220 and the base region 230, over the first dielectric layer 260, and over an isolation dielectric layer 269. In an embodiment, a base electrode 239 may be coupled to the second portion 247 of the extrinsic base region 240 through a base contact layer 238.

In an embodiment, the emitter region 250 may be formed over the base region 230. According to an embodiment, the emitter region 250 may include an intrinsic emitter region 252, a first emitter spacer layer 253, a second emitter spacer layer 254, and an emitter contact layer 256 formed over the intrinsic emitter region 252. The emitter region 250 may also include an emitter electrode 259 formed over the emitter contact layer 256, according to an embodiment.

In an embodiment, the intrinsic emitter region 252 may be formed over the base region 230, the emitter spacer layer 254, the first dielectric spacer layer 270, and the first base dielectric layer 248. In an embodiment, the intrinsic emitter region 252 may be formed using a n-type semiconductor. In other embodiments, the intrinsic emitter region 252 may be formed using a p-type semiconductor. In an embodiment, the intrinsic emitter region 252 may have a thickness of between about 100 angstroms and 1000 angstroms. In other embodiments, the intrinsic emitter region 252 may have a thickness of between about 50 angstroms and about 5000 angstroms, though other thicknesses may be used. In an embodiment that includes a p-type emitter region 250 (e.g. an pnp transistor device), the emitter region 252 may be doped with one or more of B, O, Al, or In though other dopant species may be used. In an embodiment of an p-type emitter region (e.g. a pnp transistor device), the first and second base regions 232 and 234 may be doped with one or more of P, Li, As, or Sb though other dopant species may be used. In an embodiment, the doping concentration of the intrinsic emitter region 252 may be in a range of about 5e17 cm$^{-3}$ to 5e21 cm$^{-3}$.

According to an embodiment, the emitter contact layer 256 may be formed over the intrinsic emitter region 252. In an embodiment, the emitter contact layer 256 may be formed using titanium-tungsten (TiW), titanium tungsten nitride (TiWN), tungsten silicide (WSi), cobalt silicide (CoSi), platinum silicide (PtSi), nickel platinum silicide (NiPtSi), or other suitable material(s). The emitter electrode 259 may be formed over the emitter contact layer 256, according to an embodiment. In an embodiment, the emitter electrode 259 may be formed from one of copper, aluminum, tungsten, or other suitable conducting materials.

In an embodiment, a plurality of dielectric layers 260 may be disposed laterally adjacent the base region 230 and under the extrinsic base region 240. A portion of each of the plurality of dielectric layers 260 may be disposed between a portion of the collector region 220 and the extrinsic base region 240, according to an embodiment.

In an embodiment, a first dielectric layer 261 may be formed between the lower surface 244 of the extrinsic base region 240 and a portion of the collector region 220. According to an embodiment, the first dielectric layer 261 of may be formed over a second dielectric layer 262. In an embodiment, portions of the second dielectric layer 262 may be used to form an isolation dielectric layer 269. According to an embodiment, the isolation dielectric layer 269 may be formed over a portion of the collector region 220, the base region 230, and over the sub-collector region 226 adjacent the collector sidewall 225 and the base region 230. In an embodiment, portions of each of the first dielectric layer 261 and the second dielectric layer 262 may be formed between the base region 230 and the extrinsic base region 240. In an embodiment, the first dielectric layer 261 may include a first dielectric type and the second dielectric layer 262 may include a second dielectric type. In an embodiment, the first and second dielectric types may include one or more of silicon dioxide, tetra-ethyl orthosilicate (TEOS), silicon nitride (SiN), silicon oxynitride (SiON), aluminum oxide, aluminum nitride, polyimide, benzocyclobutene (BCB), spin-on glass, or other suitable dielectric material(s). In some embodiments, the first and second dielectric types may differ. For example, the first dielectric type may include TEOS and the second dielectric type may include SiN. In other embodiments, the first and second dielectric types may be the same (e.g. both types include SiN). In an embodiment, the first dielectric layer 261 may be have a thickness between about 30 angstroms and about 70 angstroms, while other thicknesses may be used. In an embodiment, the second dielectric layer 262 may be have a thickness between about 140 angstroms and about 420 angstroms, while other thicknesses may be used.

According to an embodiment, a first spacer dielectric layer 270 may be formed over at least a portion of the extrinsic base sidewall 246. In an embodiment, an extrinsic base opening 272 may be formed in the spacer dielectric layer 265. In an embodiment, a portion of the base opening 272 may be removed, exposing a portion of the base sidewall 246 and a portion of the first dielectric layer 261. The extrinsic base opening 272 may include at least a portion of the extrinsic base sidewall 246 and a portion of the first dielectric layer 261, according to an embodiment.

Figure 2A:
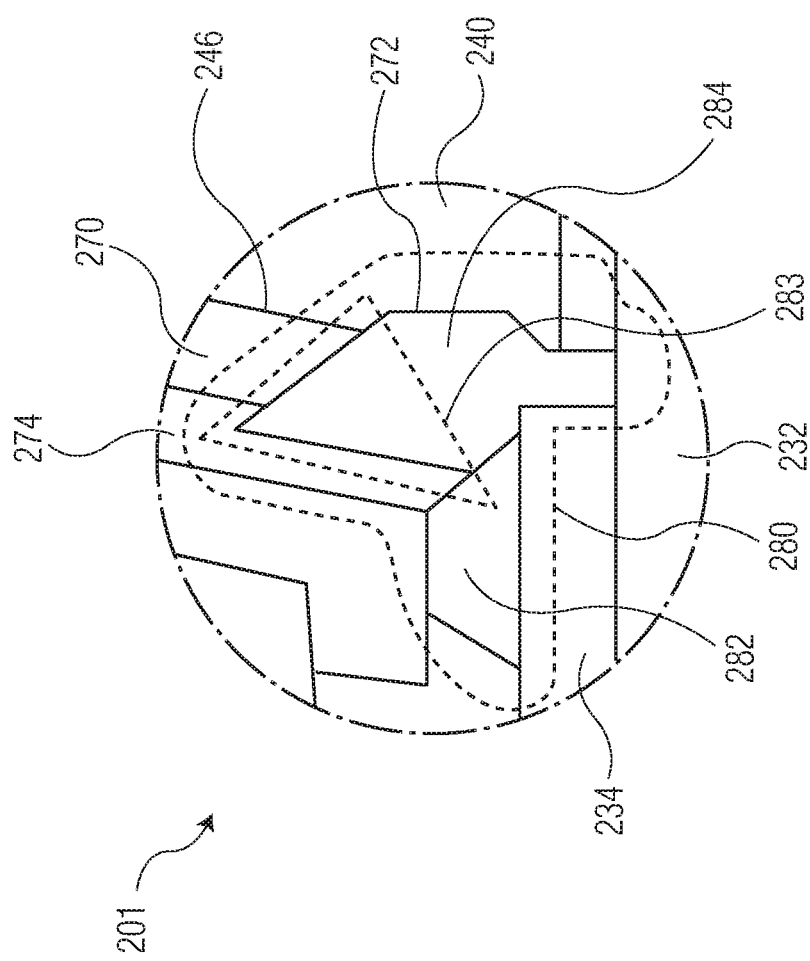
FIG. 2A is a cross sectional side view of an enlarged region of the semiconductor device of FIG. 2 in accordance with an embodiment.

Now referring simultaneously to FIG. 2 and FIG. 2A, a cross sectional side view of enlarged features of view 2A in FIG. 2, a base link region 280 may be formed proximate the second base region 234, and on at least a portion of the extrinsic base opening 272 that laterally couples at least the second base region 234 to the extrinsic base region 240, according to an embodiment. In an embodiment, the base link region 280 may include a first portion 282 and a second portion 284. In an embodiment, the first portion 282 of the base link region 280 may be formed over a portion of the first base region 232. In an embodiment, the first portion 282 of the base link region 280 may include a single crystal semiconductor (e.g. Si). In an embodiment, the second portion 284 of the base link region 280 may be coupled to the first portion 282 of the base link region 280, the first base region 232 and the second base region 234. In an embodiment, the second portion 284 of the base link region 280 may be physically and electrically connected to the first portion 282 of the base link region 280, the first base region 232 and the second base region 234. In an embodiment, the second portion of the base link region may be formed in a base link cavity 283 that is formed proximate the extrinsic base opening 272 and in a region under lower portions of the first and second spacer dielectric layers 270 and 274. In an embodiment, a portion of the second portion 284 of the base link region 280 may include a polycrystalline semiconductor (e.g. poly Si) where it contacts the base link cavity 283. In embodiments that include a p-type base region 230 (e.g. a npn transistor device), the base link region 280 may be doped with one or more of B, O, or Al, though other appropriate dopant species may be used. In embodiments that include an n-type base region (e.g. a pnp transistor device), the base link region 280 may be doped with one or more of P, As, Sb and Li, though other appropriate dopant species may be used. In an embodiment, the base link region 280 may employ the same dopant species as the base region 230. For example, the base region 230 and the base link region 280 may both include B doping, according to an embodiment.

Figure 3:
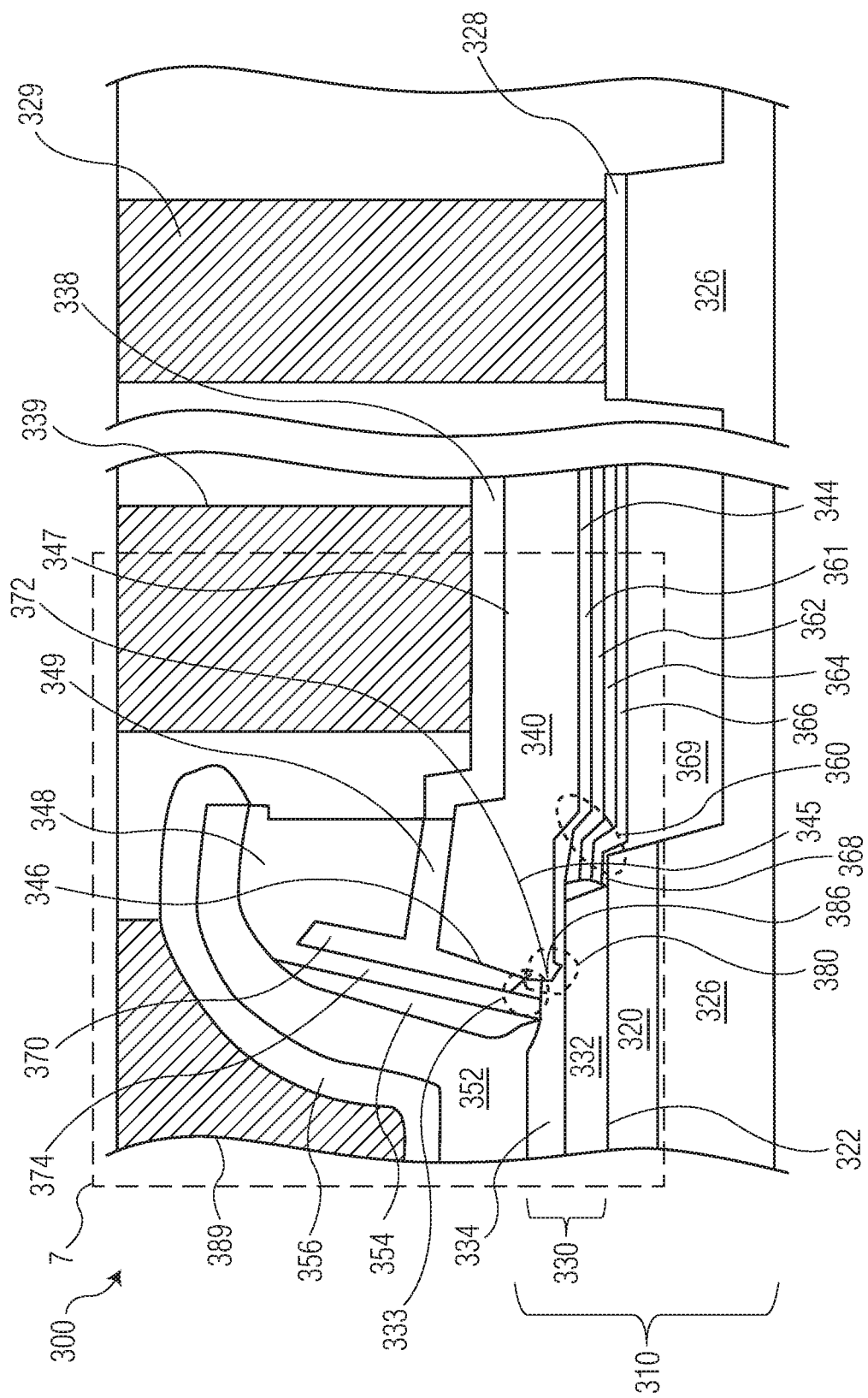
FIG. 3 is a cross sectional side view of a semiconductor device in accordance with an embodiment.
Figure 4:
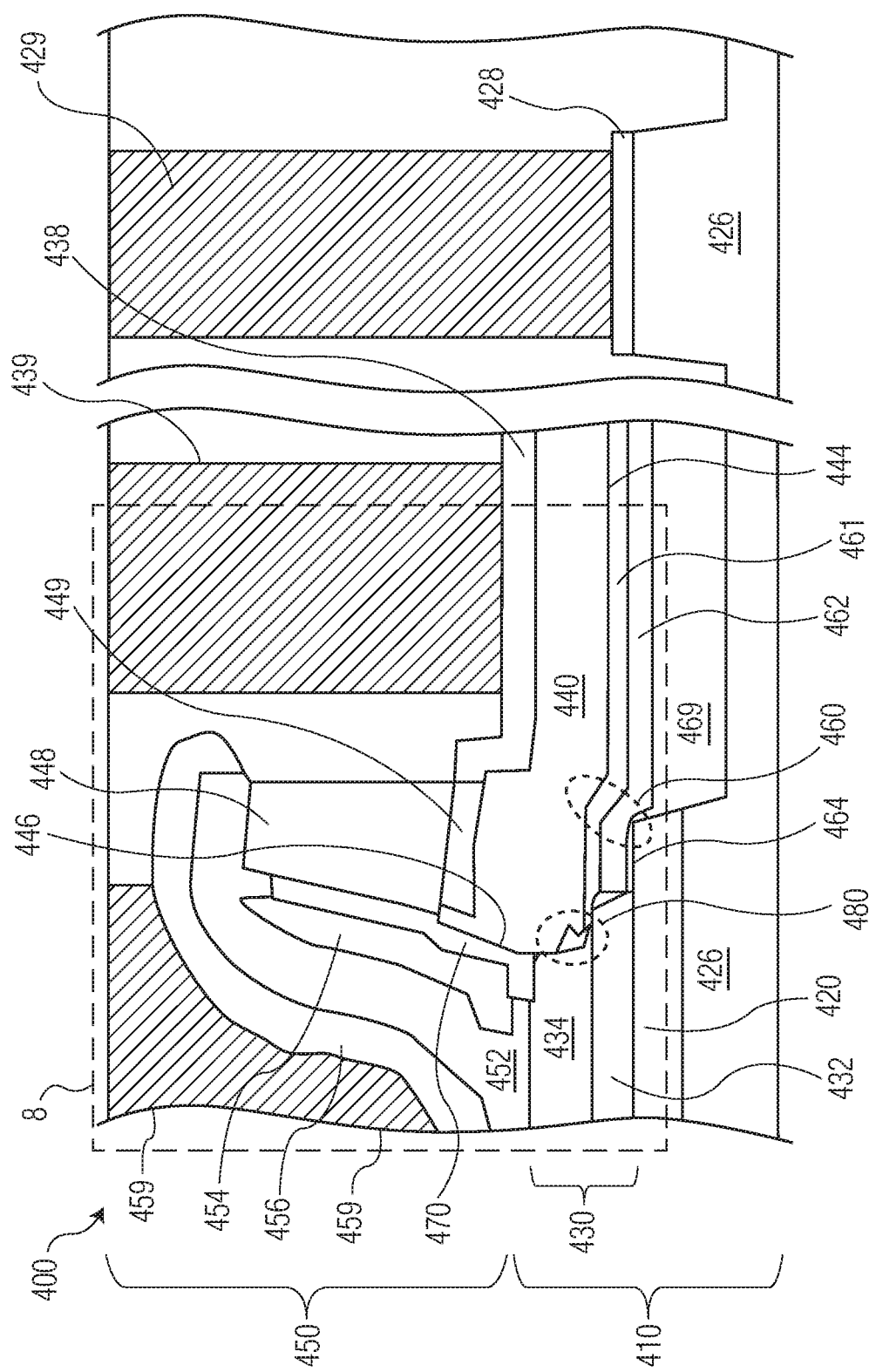
FIG. 4 is a cross sectional side view of a semiconductor device in accordance with an embodiment.
Figure 5:
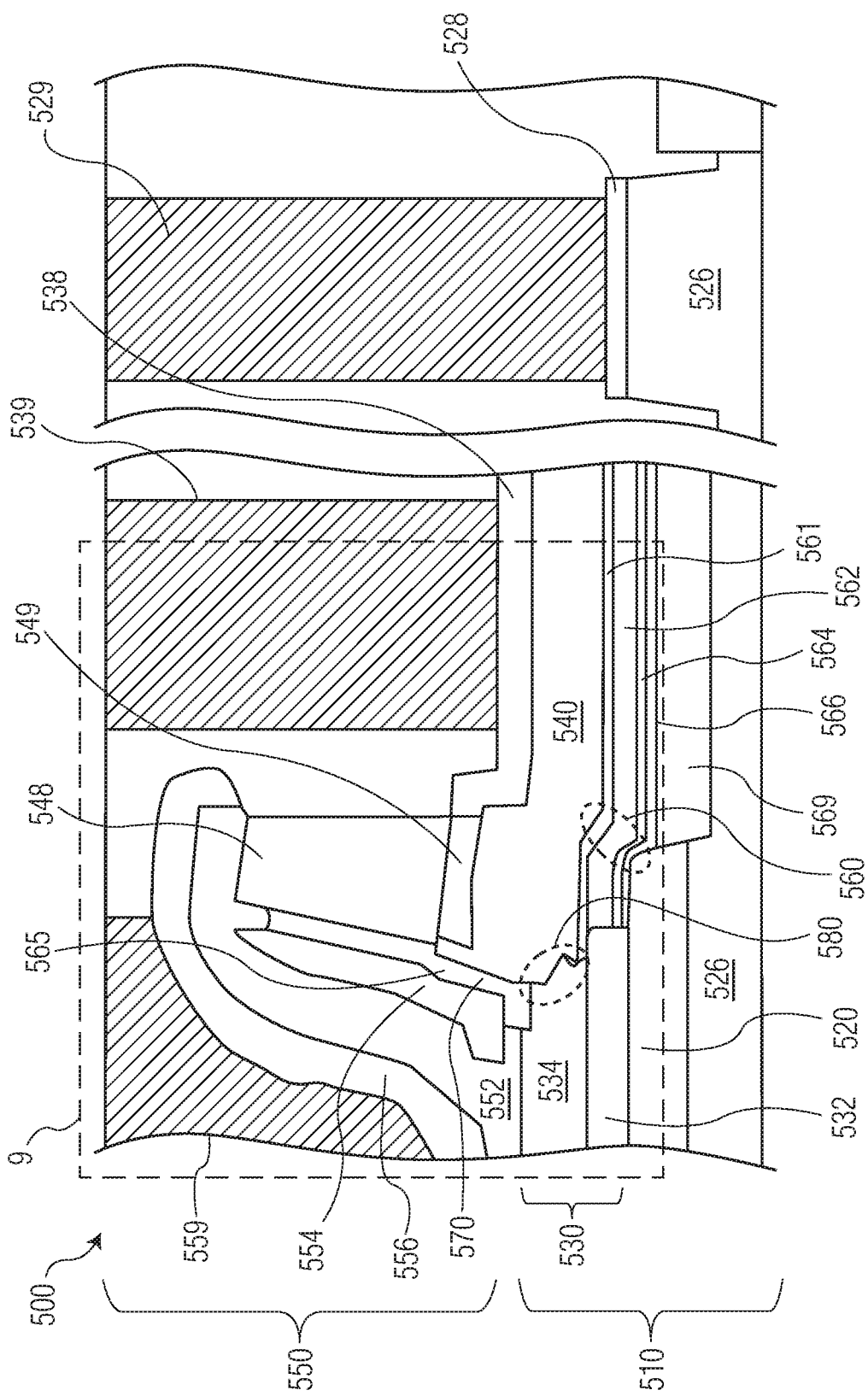
FIG. 5 is a cross sectional side view of a semiconductor device in accordance with an embodiment.

FIGS. 3, 4, and 5 depict further embodiments of semiconductor devices with base link regions in semiconductor devices 300, 400, and 500 respectively. In these embodiments, the arrangement of the dielectric layers (e.g. the plurality of dielectric layers 360, 460, and 560) may be adjusted to allow trade-offs in the performance of the transistors. This may be accomplished, in part, by altering the connection configuration of the base regions 230, 330, 430, and 530 to the extrinsic base regions 240, 340, 440, and 540 enabled by the base link regions 280, 380, 480, and 580, of FIGS. 2, 3, 4, and 5, respectively. The numbered drawings in FIGS. 3, 4, and 5 have like numbering and may be compared to the description and reference numbers associated with FIG. 2. For example, the semiconductor substrate 210 in FIG. 2 correspond to the semiconductor substrates 310, 410, and 510 in FIGS. 3-5. Also, for the sake of brevity, descriptions of numbered references and fabrication details associated with each numbered item may not be repeated where adequate descriptions were given in connection with the descriptions of FIG. 2.

FIG. 3 is a cross sectional side view of an exemplary semiconductor device 300, according to an embodiment. The semiconductor device 300 may include a semiconductor substrate 310 that includes semiconductor regions to define a collector region 320, a base region 330, an extrinsic base region 340, and an emitter region 350, a plurality of dielectric layers 360, and a base link region 380, as described above. A number of other components of the semiconductor device 300 may be configured in a manner similar to the transistor device 200 of FIG. 2. For example, the semiconductor substrate 310 and its associated semiconductor regions (e.g. collector region 320, base region 330, etc.) may be formed in a similar manner as the semiconductor substrate 210.

Referring again to FIG. 3, and in an embodiment, the plurality of dielectric layers 360 may include a first dielectric layer 361, a second dielectric layer 362 formed between the first dielectric layer 361 and the collector region 320, a third dielectric layer 364 formed between the second dielectric layer 362 and the collector region 320, a fourth dielectric layer 366 formed between the third dielectric layer and the collector region 320, and a fifth dielectric layer 368 formed between the fourth dielectric layer and the collector region 320. Each of the first dielectric layer 361, the second dielectric layer 362, the third dielectric layer 364, the fourth dielectric layer 366, and the fifth dielectric 368 layer may include a portion disposed between the extrinsic base region 340 and the collector region 320, according to an embodiment. In an embodiment, the first dielectric layer 361 may be have a thickness between about 50 angstroms and about 150 angstroms, while other thicknesses may be used. In an embodiment, the second dielectric layer 362 may be have a thickness between about 30 angstroms and about 70 angstroms, while other thicknesses may be used. In an embodiment, the third dielectric layer 364 may be have a thickness between about 40 angstroms and about 130 angstroms, while other thicknesses may be used. In an embodiment, the fourth dielectric layer 366 may be have a thickness between about 30 angstroms and about 70 angstroms, while other thicknesses may be used. In an embodiment, the fifth dielectric layer 368 may be have a thickness between about 20 angstroms and about 50 angstroms, while other thicknesses may be used. In an embodiment, each of the first dielectric layer 361, the second dielectric layer 362, the third dielectric layer 364, the fourth dielectric layer 366, and the fifth dielectric 368 layer may be formed from materials described in connection with materials used to form the first dielectric layer 361 and second dielectric layer 362 of FIG. 2. In an embodiment, the first dielectric layer 361, the third dielectric layer 364, and the fifth dielectric layer 368 may include a dielectric material of one type (e.g. TEOS) while the second dielectric layer 362 and the fourth dielectric layer 366 may include dielectric materials of a second type (e.g. SiN). In other embodiments, the types of dielectric materials used to form the first, second, third, fourth, and fifth dielectric layers 361, 362, 364, 366, and 368 may be of the same type or different types with no restrictions on how many types of dielectric materials are used (e.g. each of the first, second, third, fourth, and fifth dielectric layers 361, 362, 364, 366, and 368 may be of a different type).

FIG. 4 is a cross sectional side view of an exemplary semiconductor device 400, according to an embodiment. The semiconductor device 400 may include a semiconductor substrate 410 configured with semiconductor regions to define a collector region 420, a base region 430, an extrinsic base region 440, and an emitter region 450, a plurality of dielectric layers 460, and a base link region 480, as described above.

Referring again to FIG. 4, and in an embodiment, the plurality of dielectric layers 460 may include a first dielectric layer 461, a second dielectric layer 462 formed between the first dielectric layer 461 and the collector region 420, and a third dielectric layer 464 formed between the second dielectric layer 462 and the collector region 420. Each of the first dielectric layer 461, the second dielectric layer 462, and the third dielectric layer 464 may include a portion disposed between the extrinsic base region 440 and the collector region 420, according to an embodiment. In an embodiment, the first dielectric layer 461 may be have a thickness between about 40 angstroms and about 120 angstroms, while other thicknesses may be used. In an embodiment, the second dielectric layer 462 may be have a thickness between about 80 angstroms and about 220 angstroms, while other thicknesses may be used. In an embodiment, the third dielectric layer 464 may be have a thickness between about 20 angstroms and about 50 angstroms, while other thicknesses may be used. In an embodiment, each of the first dielectric layer 461, the second dielectric layer 462, the third dielectric layer 464 may be formed from materials described in connection with materials used to form the first dielectric layer 261 and second dielectric layer 262 of FIG. 2. In an embodiment, the first dielectric layer 461 and the third dielectric layer 464 may include a dielectric material of one type (e.g. TEOS) while the second dielectric layer 462 and the fourth dielectric layer 466 may include dielectric materials of a second type (e.g. SiN). In other embodiments, the types of dielectric materials used to form the first, second, and third dielectric layers may be of the same type or different types with no restrictions on how many types of dielectric materials are used (e.g. each of the first, second, and third dielectric layers may be of a different type).

FIG. 5 is a cross sectional side view of an exemplary semiconductor device 500, according to an embodiment. The semiconductor device 500 may include a semiconductor substrate 510 semiconductor regions to define a collector region 520, a base region 530, an extrinsic base region 540, and an emitter region 550, a plurality of dielectric layers 560, and a base link region 580, as described above.

Referring again to FIG. 5, and in an embodiment, the plurality of dielectric layers 560 may include a first dielectric layer 561, a second dielectric layer 562 formed between the first dielectric layer 561 and the collector region 520, a third dielectric layer 564 formed between the second dielectric layer 562 and the collector region 520, and a fourth dielectric layer 566 formed between the third dielectric layer 564 and the collector region 520. Each of the first dielectric layer 561, the second dielectric layer 562, the third dielectric layer 564, and the fourth dielectric layer 566 may include a portion disposed between the extrinsic base region 540 and the collector region 520, according to an embodiment. In an embodiment, the first dielectric layer 561 may be have a thickness between about 20 angstroms and about 50 angstroms, while other thicknesses may be used. In an embodiment, the second dielectric layer 562 may be have a thickness between about 20 angstroms and about 50 angstroms, while other thicknesses may be used. In an embodiment, the third dielectric layer 564 may be have a thickness between about 90 angstroms and about 250 angstroms, while other thicknesses may be used. In an embodiment, the fourth dielectric layer 566 may be have a thickness between about 20 angstroms and about 50 angstroms, while other thicknesses may be used. In an embodiment, each of the first dielectric layer 561, the second dielectric layer 562, the third dielectric layer 564, and the fourth dielectric layer 566 may be formed from materials described in connection with materials used to form the first dielectric layer 261 and second dielectric layer 262 of FIG. 2. In an embodiment, the first dielectric layer 561 and the third dielectric layer 564 may include a dielectric material of one type (e.g. TEOS) while the second dielectric layer 562 and the fourth dielectric layer 566 may include dielectric materials of a second type (e.g. SiN). In other embodiments, the types of dielectric materials used to form the first, second, and third dielectric layers may be of the same type or different types with no restrictions on how many types of dielectric materials are used (e.g. each of the first, second, and third dielectric layers may be of a different type).

The semiconductor devices 200, 300, 400, and 500 of FIGS. 2-4 disclosed above may have improved performance compared to conventional devices because of the lower base-collector feedback capacitance and base resistance. The table below summarizes the difference in simulated performance between these embodiments. In the table, "Conventional Device" refers to the conventional device 100 of FIG. 1, "transistor A" refers to the semiconductor device 200 of FIG. 2, "transistor B" refers to the semiconductor device 300 of FIG. 3, "transistor C" refers to the semiconductor device 400 of FIG. 4, and "transistor D" refers to the semiconductor device 500 of FIG. 5. The device metrics listed in the table include a peak unity gate current cutoff frequency ($f_T$) at a collector-emitter voltage of 1.5V in gigahertz (GHz), a peak maximum oscillation frequency ($f_{max}$) at a collector-emitter voltage of 1.5V in GHz, a value of peak base-emitter current gain (beta) that is dimensionless, a collector current at a 660 millivolt (mV) base-emitter voltage in microamperes (µA), a collector junction capacitance ($C_{jc}$) in femto farads (fF), an emitter junction capacitance ($C_{je}$) in fF, a collector-base breakdown voltage ($BV_{cbo}$) in volts (V), an off-state emitter-base breakdown voltage ($BV_{ebo}$) in V, and a base resistance ($R_b$) in ohms. As seen from the table, each of these embodiments may have an improved value of $f_{max}$, due, in part, to the reduced values of $R_b$ and $C_{jc}$, that arise as a result of the device improvements presented herein. Depending on the trade-offs desired between $f_T$, $f_{max}$, $BV_{cbo}$, $BV_{cbe}$, a particular embodiment of the inventive subject matter presented herein may be selected.

layers 260 over the collector region 220 and forming an extrinsic base layer 240 over the collector region 220 and the plurality of dielectric layers 260, according to an embodiment. In an embodiment, the collector region 220 may be formed by first, implanting the sub-collector region 226 by implanting a dopant species (e.g. phosphorus) using ion implantation (not shown). Forming the collector region 220 may be continued by using dry or wet etching to form a collector mesa. In an embodiment, a dielectric material (e.g. TEOS) may be deposited around the collector mesa to form an isolation dielectric layer 269 for, e.g., shallow trench isolation (STI) to provide isolation between adjacent devices. In an embodiment, forming the plurality of dielectric layers 260 may include forming a second dielectric layer 262 (e.g. TEOS) over the collector region 220 and isolation dielectric layer 269 and forming a first dielectric layer 261 (e.g. SiN) over the second dielectric layer 262. Each of the first dielectric layer 261 and the second dielectric layer 262 may include a portion disposed over the collector region 220, according to an embodiment. In an embodiment, the plurality of dielectric layers 260 may be formed using plasma enhanced chemical vapor phase deposition (PECVD), low pressure chemical vapor phase deposition (LPCVD), chemical vapor phase deposition (CVD), thermal growth techniques, or other suitable deposition techniques. For example, LPCVD may be used to form SiN layers and PECVD may be used to form TEOS layers, according to an embodiment. In an embodiment, an extrinsic base layer 240 may be formed using, e.g., poly-silicon and may be grown using MOCVD, CVD, LPCVD, PECVD, or other suitable techniques. In an embodiment, the extrinsic base layer 240 may be doped with a suitable dopant (e.g. B doping for a npn transistor). In an embodiment, additional dielectric layers (e.g. TEOS and SiN) may be grown over the extrinsic base layer 240 to form base dielectric layers 248 and 249 over the extrinsic base material 240.

| Metric | Conventional Transistor | Transistor A | Transistor B | Transistor C | Transistor D |
|---|---|---|---|---|---|
| $f_T$ (Vce = 1.5 V) [GHz] | 279 | 280 | 291 | 295 | 276 |
| $f_{max}$ (Vce = 1.5 V) [GHz] | 348 | 439 | 428 | 402 | 459 |
| Beta | 505 | 477 | 674 | 522 | 447 |
| Ic_660 mV [uA] | 8.2 | 8.4 | 8.4 | 8.1 | 8.1 |
| $C_{jc}$ [fF] | 15.8 | 11.3 | 10.8 | 14.2 | 11.7 |
| $C_{je}$ [fF] | 23.1 | — | 20.3 | 21.6 | 21.3 |
| $BV_{cbo}$ [V] | 5.6 | 6.0 | 6.0 | 5.8 | 5.9 |
| $BV_{ebo}$ [V] | 3.1 | 3.1 | 4.3 | 2.9 | 3.8 |
| $R_b$ [Ohm] | 11.8 | 10.6 | 11.4 | 10.9 | 9.8 |

FIGS. 6A, 6B, 7A, 7B, 8A, 8B, 9A, and 9B depict process flow diagrams alongside corresponding cross sectional views depicting a series of fabrication steps for producing the bipolar transistor devices 200, 300, 400, and 500 of FIGS. 2-5, in accordance with an example embodiment. method includes a sequence of steps, for which only the salient are shown for convenience in illustration. For example, the method may include a number of acts directed to preparing the semiconductor substrate for the fabrication method. The ordering of the acts may vary in other embodiments.

Figure 6A:
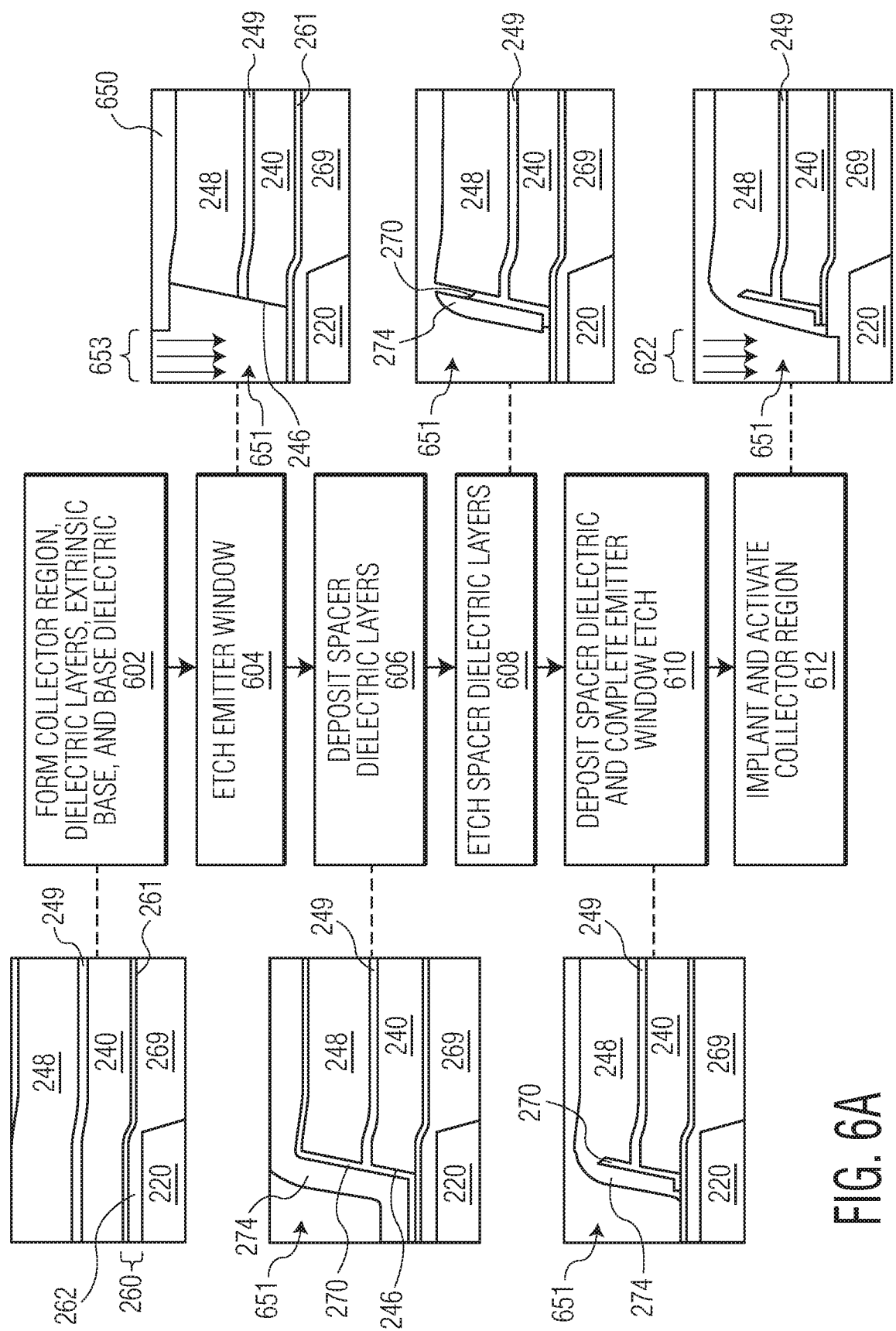
FIGS. 6A and 6B are a process flow diagrams with corresponding cross sectional views describing a method for fabricating the semiconductor devices of FIG. 2 in accordance with an embodiment.

FIG. 6A is a process flow diagram with corresponding cross sectional side views, detailing partial formation of an area 6 of FIG. 2, and describing a method for fabricating the bipolar transistor device 200 of FIG. 2 in accordance with an embodiment. Referring to FIG. 6A, in block 602, the method may include forming a collector region 220 within a semiconductor substrate 210, forming a plurality of dielectric Referring to FIG. 6A, in block 604, an embodiment of the method may include depositing and patterning a photo resist layer 650 etching an emitter window 651 through the first base dielectric layer 248, the second base dielectric layer 249, and the extrinsic base layer 240. This step forms the extrinsic base region 240, the extrinsic base sidewall 246, and the base dielectric layers 248 and 249 according to an embodiment. According to an embodiment of the method, the base dielectric layers 248 and 249 in the emitter window 651 may be etched using one or more wet and dry etches 653. In an embodiment, the wet etches may be accomplished using buffered oxide etch (a mixture of ammonium fluoride and hydrofluoric acid), hydrofluoric acid, or other suitable wet chemistries. The dry etches may be accomplished using sulfur hexafluoride, carbon tetrachloride, boron trichloride gases in a plasma etching system. Plasma etching may be accomplished using reactive ion etching (RIE), inductively coupled plasma (ICP) etching, or other suitable etch techniques. In an embodiment, wet etching may be used to remove oxide-based films (e.g. TEOS and other oxides) while nitride based films (e.g. SiN and other nitrides) may be etched with F-based dry etching. In an embodiment, the extrinsic base region 240 may be etched using dry or wet chemistries (e.g. hydrobromic acid (HBr) and chlorine (Cl)-based etching). In an embodiment, the emitter window etch may stop on the first dielectric layer 261.

Referring to FIG. 6A, in blocks 606-608, the method may further include forming a first spacer dielectric layer 270 and a second spacer dielectric layer 274 over the base dielectric layers 248 and 249, the extrinsic base region 240, and over the extrinsic base sidewall 246. In an embodiment, the spacer dielectric layer 270 may be formed using the dielectric deposition methods described above (e.g. PECVD, LPCVD, thermal deposition). According to an embodiment, anisotropic dry etching may be used to remove portions of the first spacer dielectric layer 270 deposited over the base first and second base dielectric layers 248 and 249 while retaining a portion of the first spacer dielectric 270 on the sidewall of the extrinsic base region 240.

Referring to FIG. 6A, in blocks 610-612, an embodiment of the method may include depositing additional spacer dielectric material to form the spacer dielectric layer 270 using one or more of the methods described above (e.g. PECVD, LPCVD) and then implanting and activating the collector region 220. According to an embodiment, forming the collector region 220 may include ion implantation to incorporate a dopant species into the collector region 220. In an embodiment, a dopant species 622 (e.g. phosphorous) may be implanted to form the collector region 220. In other embodiments, the collector region may be formed using epitaxial growth such as metal organic chemical vapor phase epitaxy (MOCVD), chemical vapor phase epitaxy (CVD), molecular beam epitaxy (MBE), or other suitable methods.

Figure 6B:
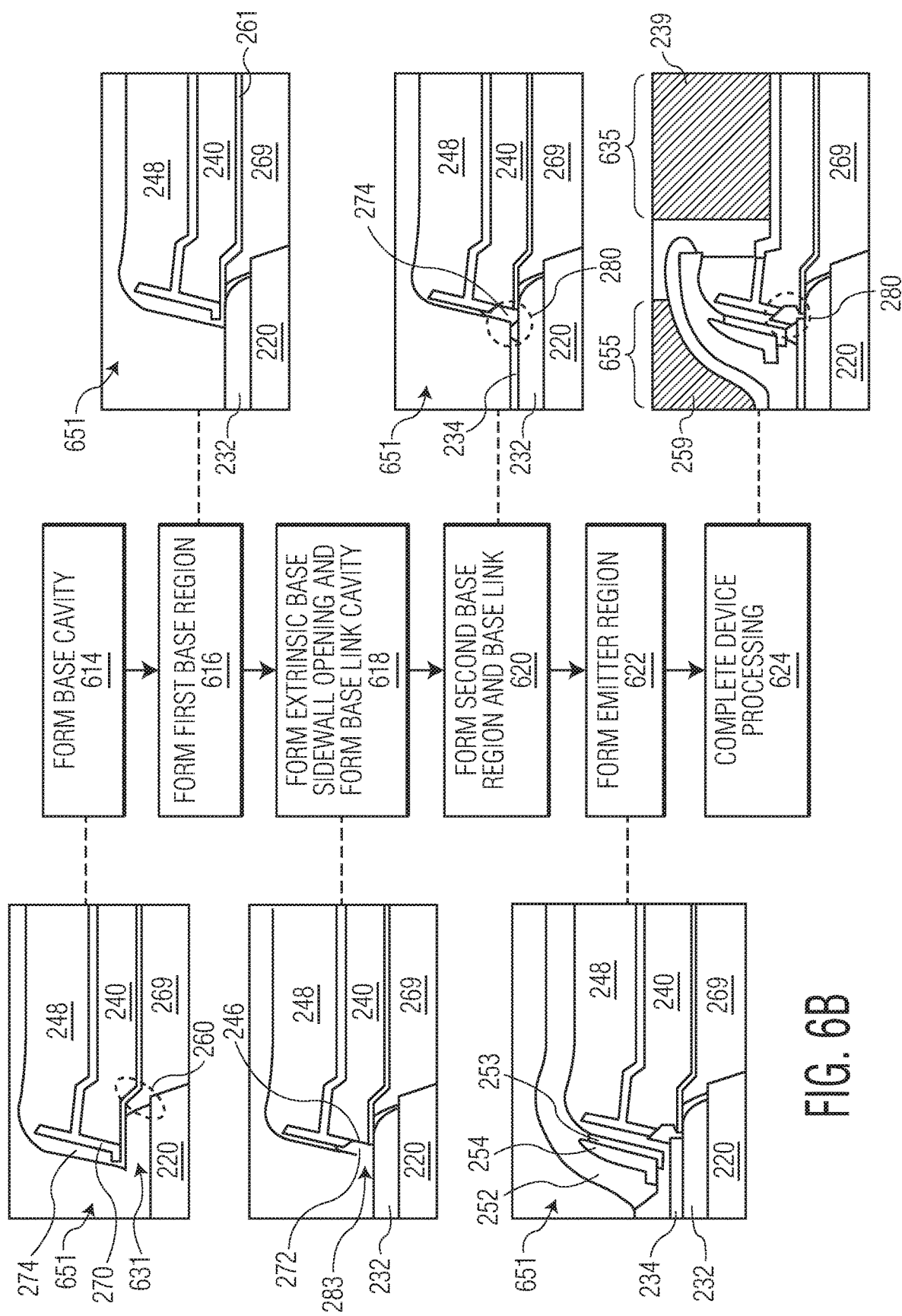

Referring to FIG. 6B, in blocks 614-616, the method may include forming a first base region 232 over the collector region 220 and adjacent the extrinsic base and forming a second base region 234 over the first base region 232, according to an embodiment. In an embodiment, and in referring to block 614, forming the first base region 232 may include forming a base cavity 631 in the first spacer dielectric layer 270 on at least a portion of the extrinsic base sidewall 246 by etching the second spacer dielectric layers 274 and at least one of the plurality of dielectric layers 260 (e.g. second dielectric layer 262), according to an embodiment. The base cavity 631 may be formed by wet etching one of the plurality of dielectric layers 260 (e.g. second dielectric layer 262) using isotropic wet and/or dry etching performed using one of the techniques described above. In an embodiment, the base cavity etch may expose an upper surface of the collector region 220. In an embodiment, the first base region 232 may be formed using selective epitaxial growth over the exposed surface of collector region 220. In an embodiment, CVD or MOCVD may be used to epitaxially grow the first base region using selective epitaxial growth. In an embodiment, the selective epitaxial growth may be facilitated by allowing the epitaxial material to only nucleate on the exposed semiconductor regions (e.g. the collector region 220). The epitaxial material will not nucleate on and grow over the surrounding semiconductor areas. In an embodiment, the first base region 232 may be formed on the exposed collector region surface and fill the base cavity 631 to the extent that the plurality of dielectric layers 260 has been removed.

Referring now to FIG. 6B, block 618, forming an extrinsic base opening 272 in the spacer dielectric layer on at least a portion of the extrinsic base sidewall 246 may be achieved by etching the first spacer dielectric layer 270 and at least one of the plurality of dielectric layers 260, according to an embodiment. In an embodiment, the etching of the plurality of dielectric layers 260 may be accomplished using the methods for etching oxides and nitrides discussed above. In an embodiment, an opening may form a base link cavity 283 that exposes the sidewall 246 of the extrinsic base region 240.

Referring now to FIG. 6B, block 620, forming the second base region 234 may include forming a base link region 280 on at least a portion of the extrinsic base opening 272 that laterally couples the second base region 234 to the extrinsic base region 240, according to an embodiment. In an embodiment, forming the second base region 234 may include contacting a portion of the extrinsic base region 240 through the extrinsic base opening 272 to form the base link region 280. In an embodiment, the base link region 280 may couple the extrinsic base sidewall 246 to the second base region 234.

Referring now to FIG. 6B, block 622, in an embodiment, the method may include forming an intrinsic emitter region 252 over the base region 230. First and second emitter spacers 253 and 254 may be formed over the second dielectric spacer 274 by depositing dielectric layers inside the emitter window 651 and utilizing anisotropic vertical etching to remove the dielectric over the base region 230 while leaving the dielectric layers on the sidewalls of the emitter window 651. In an embodiment, the first emitter spacer 253 may include, e.g., TEOS and the second emitter spacer 254 may include, e.g., SiN, though other materials may be used. Following spacer formation, the intrinsic emitter region 252 may be formed. In an embodiment, CVD or MOCVD may be used to epitaxially grow the intrinsic emitter region 252 using selective epitaxial growth.

Referring now to FIG. 6B, block 624, in an embodiment, device processing may be completed by etching openings 635 and 655 in the first and second base dielectric layers 248 and 249, forming base contact layer 238 emitter contact layer 256, and forming the emitter and base electrodes 259 and 239, according to an embodiment. Following this, other processing may follow, depending on the device application and requirements (not shown).

FIGS. 7A, 7B, 8A, 8B, 9A, and 9B depict various methods for forming bipolar transistor devices with arrangements of the plurality of dielectric layers to according to the embodiments of bipolar transistor devices 300, 400, and 500 of FIG. 3, FIG. 4, and FIG. 5, respectively. The numbered drawing in these figures have like numbering and may be compared to the description associated with FIGS. 6A and 6B and the corresponding numbering in FIGS. 3-5. For example, the semiconductor substrate 210 in FIGS. 6A and 6B correspond to the semiconductor substrates 310, 410, and 510 in FIGS. 3-5 and 7A/7B, 8A/8B, and 9A/9B. Also, for the sake of brevity, descriptions of numbered references and fabrication details associated with each numbered item or step may not be repeated where adequate descriptions were given in connection with the descriptions of FIGS. 6A and 6B and FIG. 2.

Figure 7A:
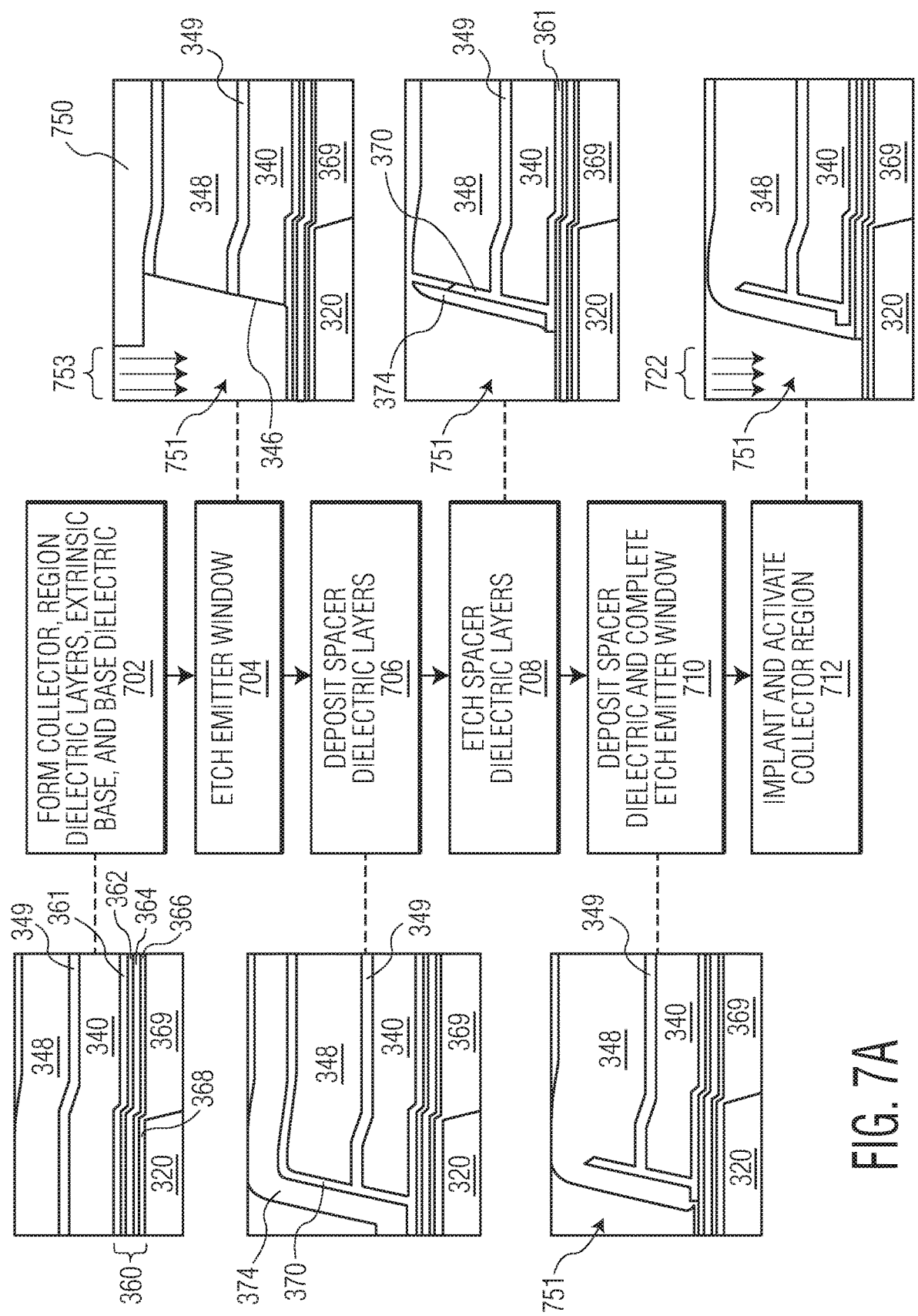
FIGS. 7A and 7B are a process flow diagrams with corresponding cross sectional views describing a method for fabricating the semiconductor devices of FIG. 3 in accordance with an embodiment.
Figure 7B:
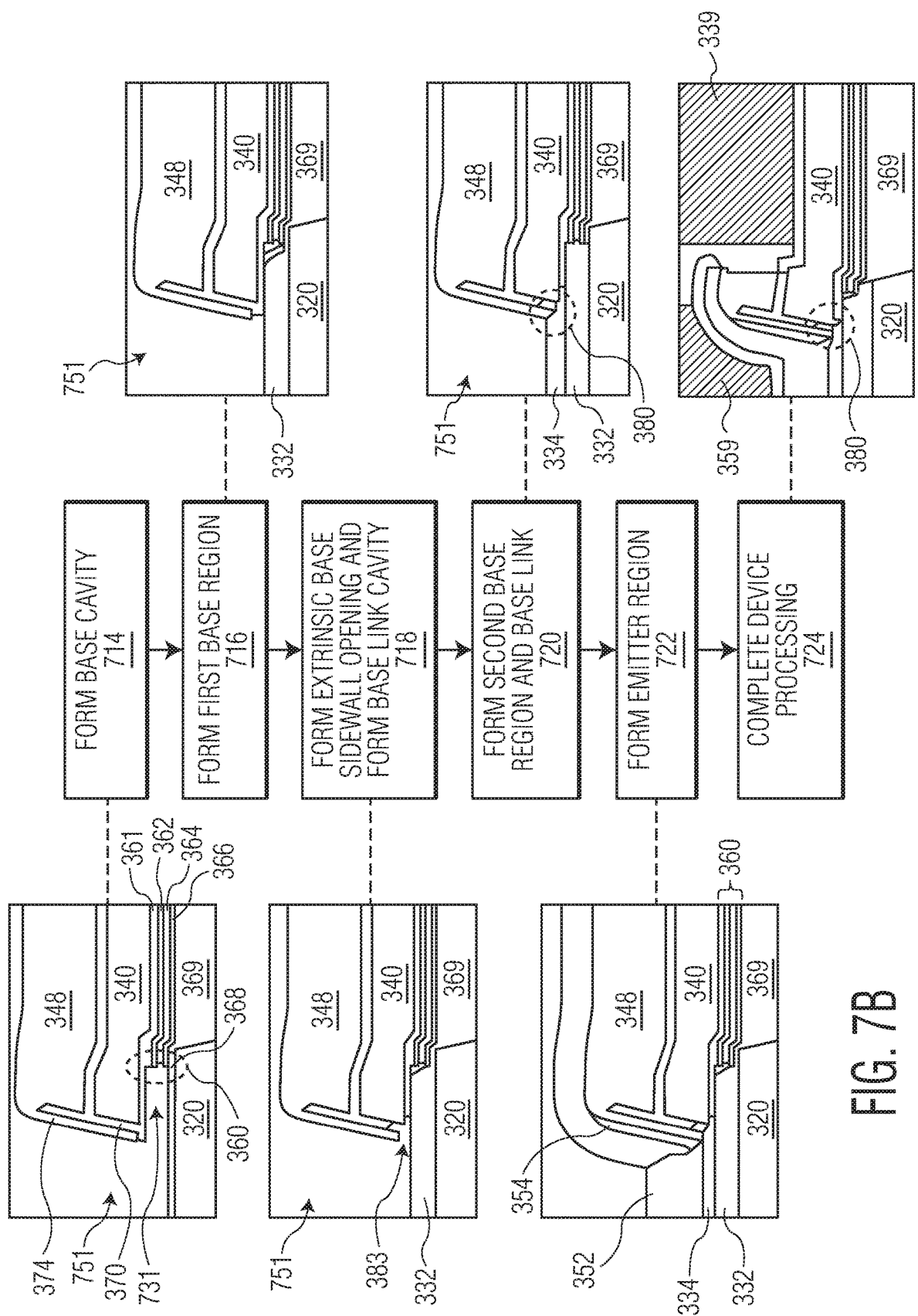

FIGS. 7A and 7B depict a process flow process flow diagram with corresponding cross sectional side views, detailing forming an area 7 of FIG. 3, and describing a method for fabricating bipolar transistor device 300 of FIG. 3 in accordance with an embodiment. Referring now to FIG. 7A, block 702, and, in an embodiment, forming the plurality of dielectric layers 360 may include (starting from the first layer over the collector region 320), forming a fifth dielectric layer 368 (e.g. TEOS) over the collector region 320, forming a fourth dielectric layer 366 (e.g. SiN) over the fifth dielectric layer 368, forming a third dielectric layer 364 (e.g. TEOS) over the fourth dielectric layer 366, forming a second dielectric layer 362 (e.g. SiN) over the third dielectric layer 364, and forming a first dielectric layer 361 (e.g. TEOS) over the second dielectric layer 362. According to an embodiment, each of the first dielectric layer 361, the second dielectric layer 362, the third dielectric layer 364, the fourth dielectric layer 366, and the fifth dielectric layer 368 may include a portion disposed over the collector region 320. The remaining fabrication steps detailed in blocks 704-712 may be performed analogously to those of described in connection with blocks 604-612 of FIG. 6A.

Referring now to FIG. 7B, block 714, and in an embodiment, the fifth dielectric layer 368 of the plurality of dielectric layers 360 may be retained over the collector region 220 once the base cavity 731 is formed. Of note, this avoids exposure of the surface of the collector region 220 until just prior to forming the first base region in the next step. This results in better process control, yield, and repeatability. Referring again to FIG. 7B, block 716-724, in an embodiment, the fabrication steps to complete the processing of semiconductor device 300 of FIG. 3 may be completed in a manner analogous to that of blocks 614-624 of FIG. 6B.

Figure 8B:
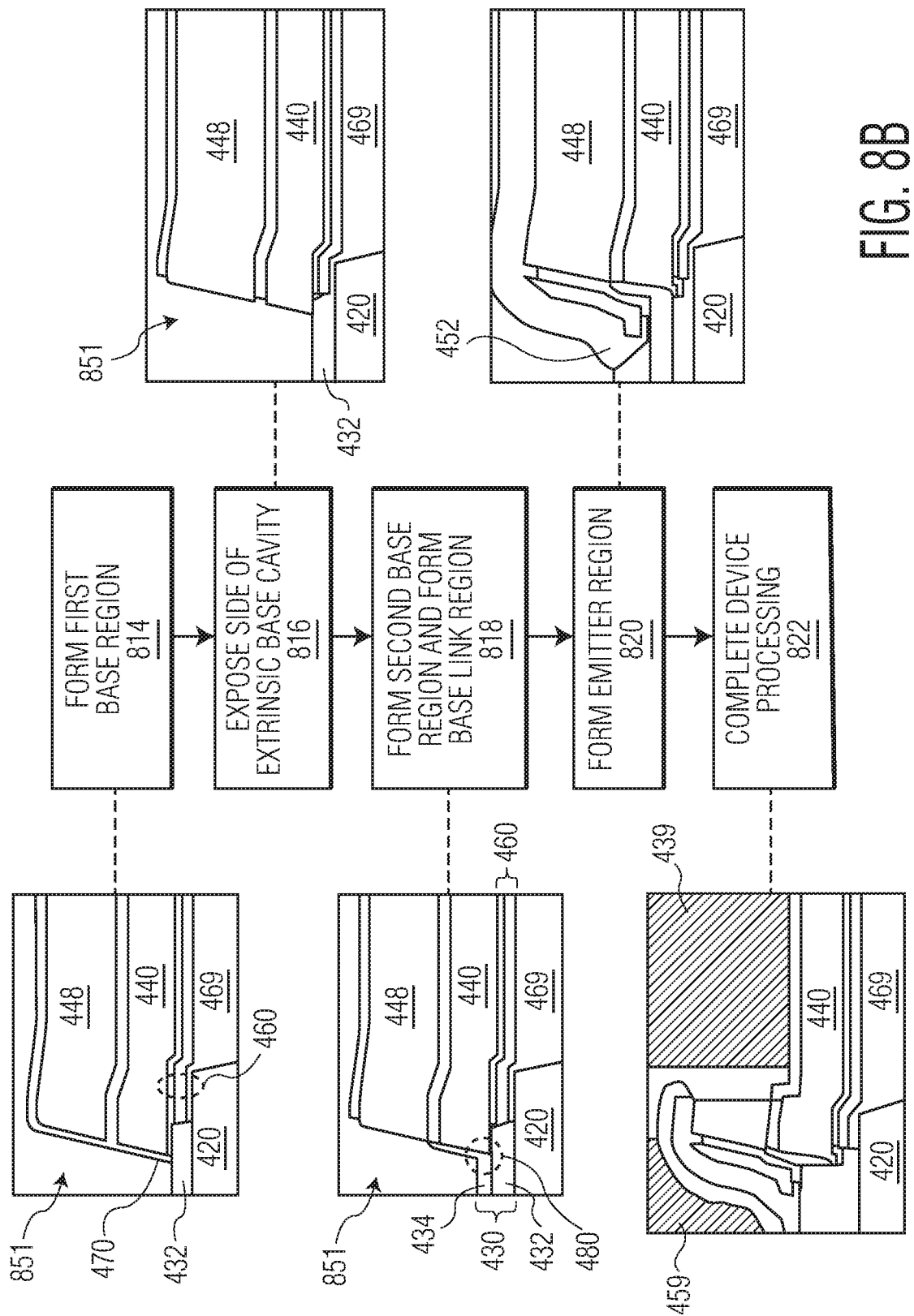

FIGS. 8A and 8B depict a process flow process flow diagram with corresponding cross sectional views, detailing forming an area 8 of FIG. 4, and describing a method for fabricating bipolar transistor device 400 of FIG. 4 in accordance with an embodiment. Referring now to FIG. 8A, block 802, and in an embodiment, forming the plurality of dielectric layers 460 may include forming a third dielectric layer 464 (e.g. TEOS) over the collector region 420, forming a second dielectric layer 462 (e.g. SiN) over the third dielectric layer 464, and forming a first dielectric layer 461 (e.g. TEOS) over the second dielectric layer 462. In an embodiment, each of the first dielectric layer 461, the second dielectric layer 462, and the third dielectric layer 464 may include a portion disposed over the collector region 420. The remaining fabrication steps, detailed in blocks 804-812 may be performed analogously to those of described in connection with blocks 604-612 of FIG. 6A. Referring now to FIG. 8A, block 812, and in an embodiment, the third dielectric layer 464 of the plurality of dielectric layers 460 may be retained over the collector region 220 once the base cavity 831 is formed.

Referring now to FIG. 8B, blocks 814-822 and, in an embodiment, the fabrication steps to complete the processing of semiconductor device 400 of FIG. 4 may be completed in a manner analogous to that of blocks 614-624 of FIG. 6B. The details are not repeated here for the sake of brevity.

Figure 9A:
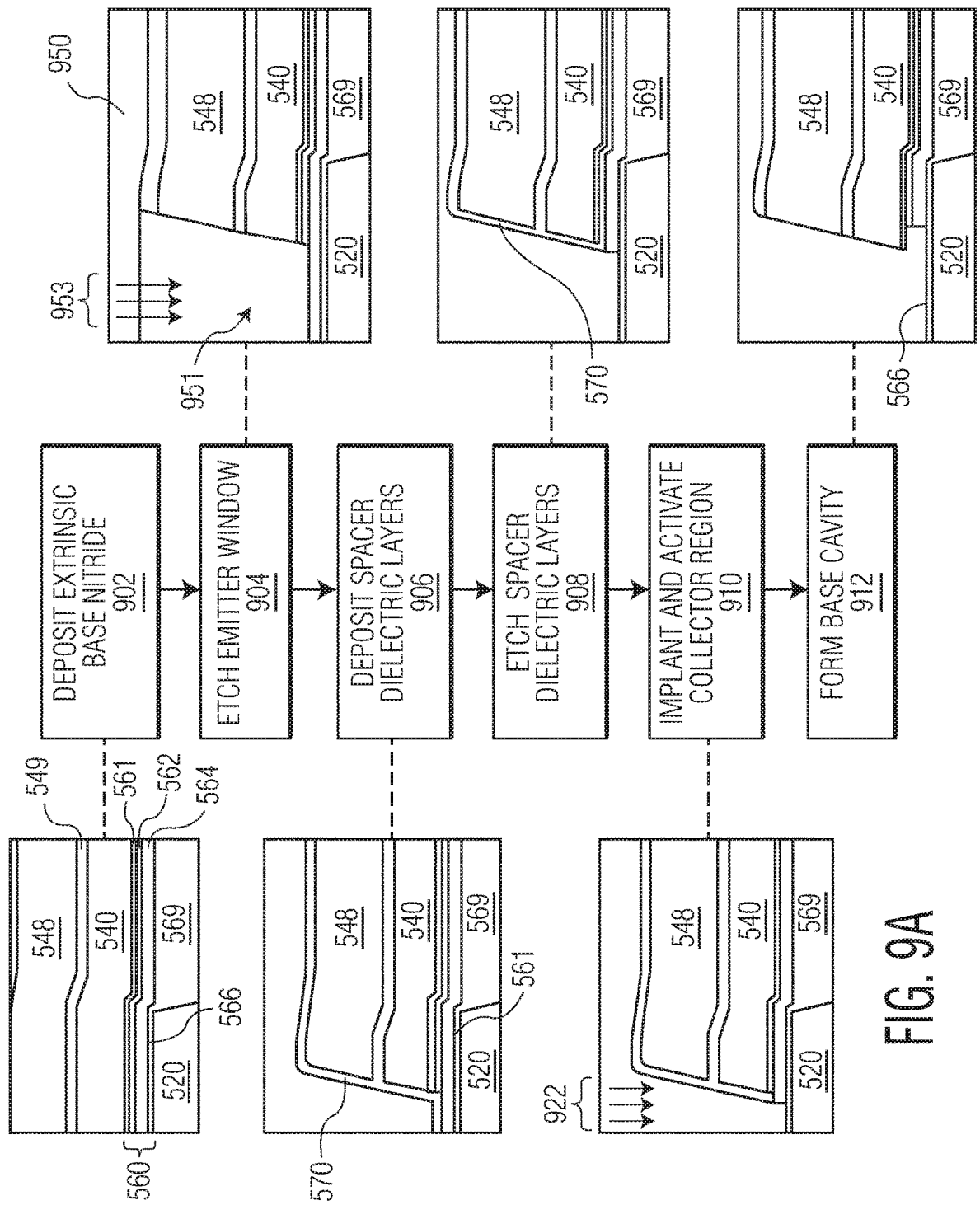

FIGS. 9A and 9B depict a process flow process flow diagram with corresponding cross sectional side views, detailing forming an area 9 of FIG. 5, and describing a method for fabricating bipolar transistor device 500 of FIG. 5 in accordance with an embodiment. Referring now to FIG. 9A, block 902, and in an embodiment, forming the plurality of dielectric layers 560 may include forming a fourth dielectric layer 566 over the collector region 520, forming a third dielectric layer 564 over the fourth dielectric layer 566, forming a second dielectric layer 562 over the third dielectric layer 564, and forming a first dielectric layer 561 over the second dielectric layer 562. Each of the first dielectric layer 561, the second dielectric layer 562, the third dielectric layer 564, and the fourth dielectric layer 566 may include a portion disposed over the collector region 520, according to an embodiment. The remaining fabrication steps, detailed in blocks 904-910 may be performed analogously to those of described in connection with blocks 604-612 of FIG. 6A. Referring now to FIG. 9A, block 912, and in an embodiment, the fourth dielectric layer 566 of the plurality of dielectric layers 560 may be retained over the collector region 520 once the base cavity 831 is formed.

Likewise, referring now to FIG. 9B, blocks 914-924, in an embodiment, the fabrication steps to complete the processing of semiconductor device 500 of FIG. 5 may be completed in a manner analogous to that of blocks 614-624 of FIG. 6B. For the sake of brevity, the details of these steps are not repeated.

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

For the sake of brevity, conventional semiconductor fabrication techniques may not be described in detail herein. In addition, certain terminology may also be used herein for reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A semiconductor device comprising:
   a semiconductor substrate;
   a collector region formed within the semiconductor substrate, having an upper surface and a collector sidewall;
   a base region, that includes a first base region disposed over the collector region and a second base region disposed over and coupled to the first base region;

an extrinsic base region that includes an upper surface, a lower surface, and an extrinsic base sidewall formed laterally adjacent to and coupled to the base region; and
a base link region disposed proximate to and coupled to the second base region, wherein the base link region couples the extrinsic base sidewall to the second base region.

2. The semiconductor device of claim 1, further comprising a first spacer dielectric layer disposed over at least a portion of the extrinsic base sidewall.

3. The semiconductor device of claim 2, further comprising an extrinsic base opening formed in the first spacer dielectric layer, wherein the extrinsic base opening includes a portion of the extrinsic base sidewall.

4. The semiconductor device of claim 3, wherein the base link region is formed within at least a portion of the extrinsic base opening.

5. The transistor device of claim 4, wherein a portion of the base link region is formed within a base link cavity formed between the extrinsic base opening and a second spacer dielectric layer disposed over the first spacer dielectric layer.

6. The semiconductor device of claim 5, further comprising a first dielectric layer formed under the lower surface of the extrinsic base region and over a portion of the collector region, wherein a portion of the first dielectric layer is formed between the first base region and the extrinsic base region.

7. The transistor device of claim 6, further comprising a plurality of dielectric layers disposed laterally adjacent the base region, under the extrinsic base region, wherein a portion of each of the plurality of dielectric layers are disposed between a portion of the collector region and the extrinsic base region.

8. The transistor device of claim 7, wherein the plurality of dielectric layers includes a first dielectric layer with a portion formed over a portion of the collector region and a second dielectric layer formed under the first dielectric layer.

9. The transistor device of claim 8, further comprising a third dielectric layer formed under the second dielectric layer.

10. The transistor device of claim 9, further comprising a fourth dielectric layer formed under the third dielectric layer.

11. The transistor device of claim 10, further comprising a fifth dielectric layer formed under the third dielectric layer.

12. The semiconductor device of claim 1, further comprising an emitter region disposed over the base region.

13. The semiconductor device of claim 1, wherein the semiconductor substrate, the collector region and the base region comprise silicon and wherein the base region comprises an alloy of silicon and germanium.

14. A bipolar transistor device comprising:
a semiconductor substrate;
a collector region formed within the semiconductor substrate, having an upper surface and a collector sidewall;
a base region disposed over the collector region, comprising a first base region and a second base region disposed over and coupled to the first base region;
an emitter region disposed over the base region;
an extrinsic base region that includes an upper surface, a lower surface, and an extrinsic base sidewall laterally adjacent to and coupled to the base region;
a plurality of dielectric layers disposed laterally adjacent the base region, under the extrinsic base region, wherein a portion of each of the plurality of dielectric layers are disposed between a portion of the collector region and the extrinsic base region;
a spacer dielectric layer disposed over at least a portion of the extrinsic base sidewall;
an extrinsic base opening formed in the spacer dielectric layer, wherein the extrinsic base opening includes a portion of the extrinsic base sidewall; and
a base link region disposed proximate the second base region, and on at least a portion of the extrinsic base opening, that laterally couples at least the second base region to the extrinsic base region, wherein the extrinsic base sidewall is coupled to a sidewall of the second base region.

15. The bipolar transistor device of claim 14, wherein the plurality of dielectric layers includes a first dielectric layer formed over a second dielectric layer formed between the first dielectric layer and the collector region, and wherein each of the first and second dielectric layer include a portion disposed between the extrinsic base region and the collector region.

16. The bipolar transistor device of claim 14, wherein the plurality of dielectric layers includes a first dielectric layer, a second dielectric layer formed between the first dielectric layer and the collector region, a third dielectric layer formed between the second dielectric layer and the collector region, a fourth dielectric layer formed between the third dielectric layer and the collector region, and a fifth dielectric layer formed between the fourth dielectric layer and the collector region, wherein each of the first dielectric layer, the second dielectric layer, the third dielectric layer, the fourth dielectric layer, and the fifth dielectric layer include a portion disposed between the extrinsic base region and the collector region.

17. The bipolar transistor device of claim 14, wherein the plurality of dielectric layers includes a first dielectric layer, a second dielectric layer formed between the first dielectric layer and the collector region, and a third dielectric layer formed between the second dielectric layer and the collector region, wherein each of the first dielectric layer, the second dielectric layer, and the third dielectric layer include a portion disposed between the extrinsic base region and the collector region.

18. The bipolar transistor device of claim 14, wherein the plurality of dielectric layers includes a first dielectric layer, a second dielectric layer formed between the first dielectric layer and the collector region, a third dielectric layer formed between the second dielectric layer and the collector region, a fourth dielectric layer formed between the third dielectric layer and the collector region, and a fourth dielectric layer formed between the third dielectric layer and the collector region, wherein each of the first dielectric layer, the second dielectric layer, the third dielectric layer, and the fourth dielectric layer include a portion disposed between the extrinsic base region and the collector region.

19. A method for forming a bipolar transistor, the method comprising:
forming a collector region within a semiconductor substrate;
forming a plurality of dielectric layers over the collector region;
forming an extrinsic base layer over the collector region and the plurality of dielectric layers;
etching an emitter window through the extrinsic base layer over the collector region to form an extrinsic base sidewall and an extrinsic base region;
forming a spacer dielectric layer over the extrinsic base region and over the extrinsic base sidewall;
forming a first opening in the spacer dielectric layer on at least a portion of the extrinsic base sidewall by etching the spacer dielectric layer and at least one of the plurality of dielectric layers;

forming a first base region over the collector region and adjacent the extrinsic base;

forming a second base region over the first base region, wherein forming the second base region includes forming a base link region on at least a portion of the extrinsic base opening that laterally couples the second base region to the extrinsic base region, wherein the base link region couples the extrinsic base sidewall to the base sidewall; and forming an emitter region over the base region.

20. The method of claim 19, wherein forming the plurality of dielectric layers includes forming a second dielectric layer over the collector region and forming a first dielectric layer over the second dielectric layer, wherein each of the first dielectric layer and the second dielectric layer include a portion disposed over the collector region, and wherein etching the emitter window includes stopping the etch on the plurality of dielectric layers.

21. The method of claim 19, wherein forming the plurality of dielectric layers includes forming a fifth dielectric layer over the collector region, forming a fourth dielectric layer over the fifth dielectric layer, forming a third dielectric layer over the fourth dielectric layer, forming a second dielectric layer over the third dielectric layer, and forming a first dielectric layer over the second dielectric layer, wherein each of the first dielectric layer, the second dielectric layer, the third dielectric layer, the fourth dielectric layer, and the fifth dielectric layer include a portion disposed over the collector region, and wherein etching the emitter window includes stopping the etch on the plurality of dielectric layers.

22. The method of claim 19, wherein forming the plurality of dielectric layers includes forming a third dielectric layer over the collector region, forming a second dielectric layer over the third dielectric layer, and forming a first dielectric layer over the second dielectric layer, wherein each of the first dielectric layer, the second dielectric layer, and the third dielectric layer include a portion disposed over the collector region.

23. The method of claim 19, wherein forming the plurality of dielectric layers includes forming a fourth dielectric layer over the collector region, forming a third dielectric layer over the fourth dielectric layer, forming a second dielectric layer over the third dielectric layer, and forming a first dielectric layer over the second dielectric layer, wherein each of the first dielectric layer, the second dielectric layer, the third dielectric layer, and the fourth dielectric layer include a portion disposed over the collector region.

* * * * *